United States Patent
Taniguchi et al.

(10) Patent No.: US 9,129,838 B2
(45) Date of Patent: Sep. 8, 2015

(54) SEMICONDUCTOR DEVICE AND ELECTRONIC APPARATUS

(71) Applicant: SHARP KABUSHIKI KAISHA, Osaka-shi, Osaka (JP)

(72) Inventors: Kiyomi Taniguchi, Osaka (JP); Jun Ueda, Osaka (JP); Atsushi Ono, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/359,382

(22) PCT Filed: Sep. 27, 2012

(86) PCT No.: PCT/JP2012/074973
§ 371 (c)(1),
(2) Date: May 20, 2014

(87) PCT Pub. No.: WO2013/077081
PCT Pub. Date: May 30, 2013

(65) Prior Publication Data
US 2014/0306238 A1    Oct. 16, 2014

(30) Foreign Application Priority Data

Nov. 24, 2011   (JP) ................................. 2011-256685
Feb. 17, 2012   (JP) ................................. 2012-033036

(51) Int. Cl.
*H01L 21/02*      (2006.01)
*H01L 27/088*     (2006.01)
(Continued)

(52) U.S. Cl.
CPC ...... *H01L 27/0883* (2013.01); *H01L 23/49562* (2013.01); *H01L 23/49575* (2013.01); *H01L 24/49* (2013.01); *H01L 29/2003* (2013.01); *H01L 24/06* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01);
(Continued)

(58) Field of Classification Search
CPC ........... H01L 2224/78247; H01L 2224/48137; H01L 23/49575; H01L 27/0883
USPC .................................................. 257/E27.011
See application file for complete search history.

(56) References Cited

U.S. PATENT DOCUMENTS 5,684,332 A *   11/1997   Chen et al. ..................... 257/678
2008/0258184 A1* 10/2008   Sankin et al. .................. 257/265
(Continued)

FOREIGN PATENT DOCUMENTS

JP      2011-29386      2/2011

OTHER PUBLICATIONS

Int'l. Search Report for PCT/JP2012/074973, mailed Dec. 25, 2012.
(Continued)

*Primary Examiner* — John C Ingham
(74) *Attorney, Agent, or Firm* — Nixon & Vanderhye, P.C.

(57) ABSTRACT

According to a semiconductor device (101), a first switching active element (103) of a normally-on type and a second switching active element (104) of a normally-off type are cascode-connected to each other. This causes an electric current path to be formed. The first and second switching active elements (103, 104) are provided and connected so that loop area of the electric current path is a minimum area in a plan view of the semiconductor device (101).

8 Claims, 12 Drawing Sheets

(51) Int. Cl.
　　*H01L 23/495*　　(2006.01)
　　*H01L 29/20*　　(2006.01)
　　*H01L 23/00*　　(2006.01)

(52) U.S. Cl.
　　CPC .............. *H01L 2224/04026* (2013.01); *H01L 2224/04042* (2013.01); *H01L 2224/0603* (2013.01); *H01L 2224/06181* (2013.01); *H01L 2224/291* (2013.01); *H01L 2224/2919* (2013.01); *H01L 2224/29139* (2013.01); *H01L 2224/32245* (2013.01); *H01L 2224/45124* (2013.01); *H01L 2224/48091* (2013.01); *H01L 2224/48137* (2013.01); *H01L 2224/48247* (2013.01); *H01L 2224/48257* (2013.01); *H01L 2224/4903* (2013.01); *H01L 2224/49052* (2013.01); *H01L 2224/49175* (2013.01); *H01L 2224/73265* (2013.01); *H01L 2224/92247* (2013.01); *H01L 2924/1033* (2013.01); *H01L 2924/1306* (2013.01); *H01L 2924/13062* (2013.01); *H01L 2924/13091* (2013.01); *H01L 2924/3011* (2013.01); *H01L 2924/30105* (2013.01); *H01L 2924/30107* (2013.01)

(56) References Cited

U.S. PATENT DOCUMENTS

| | | |
|---|---|---|
| 2011/0049580 A1 | 3/2011 | Lui et al. |
| 2011/0133212 A1* | 6/2011 | Sheridan et al. ............... 257/77 |
| 2011/0193619 A1* | 8/2011 | Parikh et al. ................... 327/534 |

OTHER PUBLICATIONS

Written Opinion of the ISA (Non-English) for PCT/JP2012/074973, mailed Dec. 25, 2012.

* cited by examiner

F I G. 6
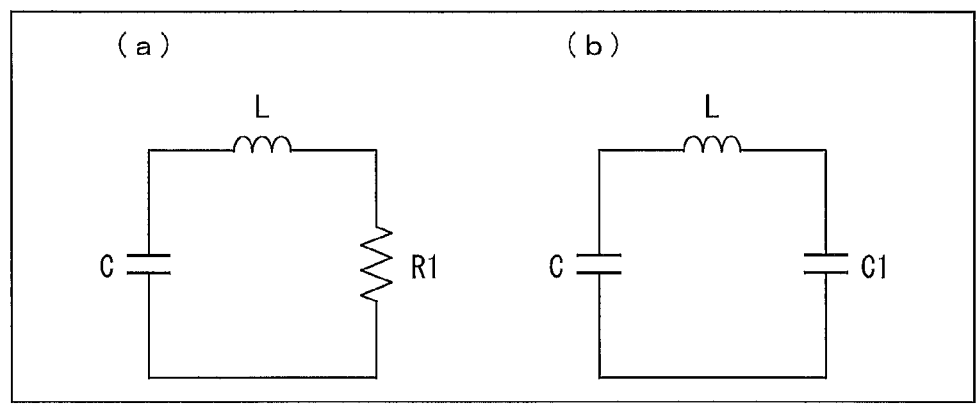

F I G. 8
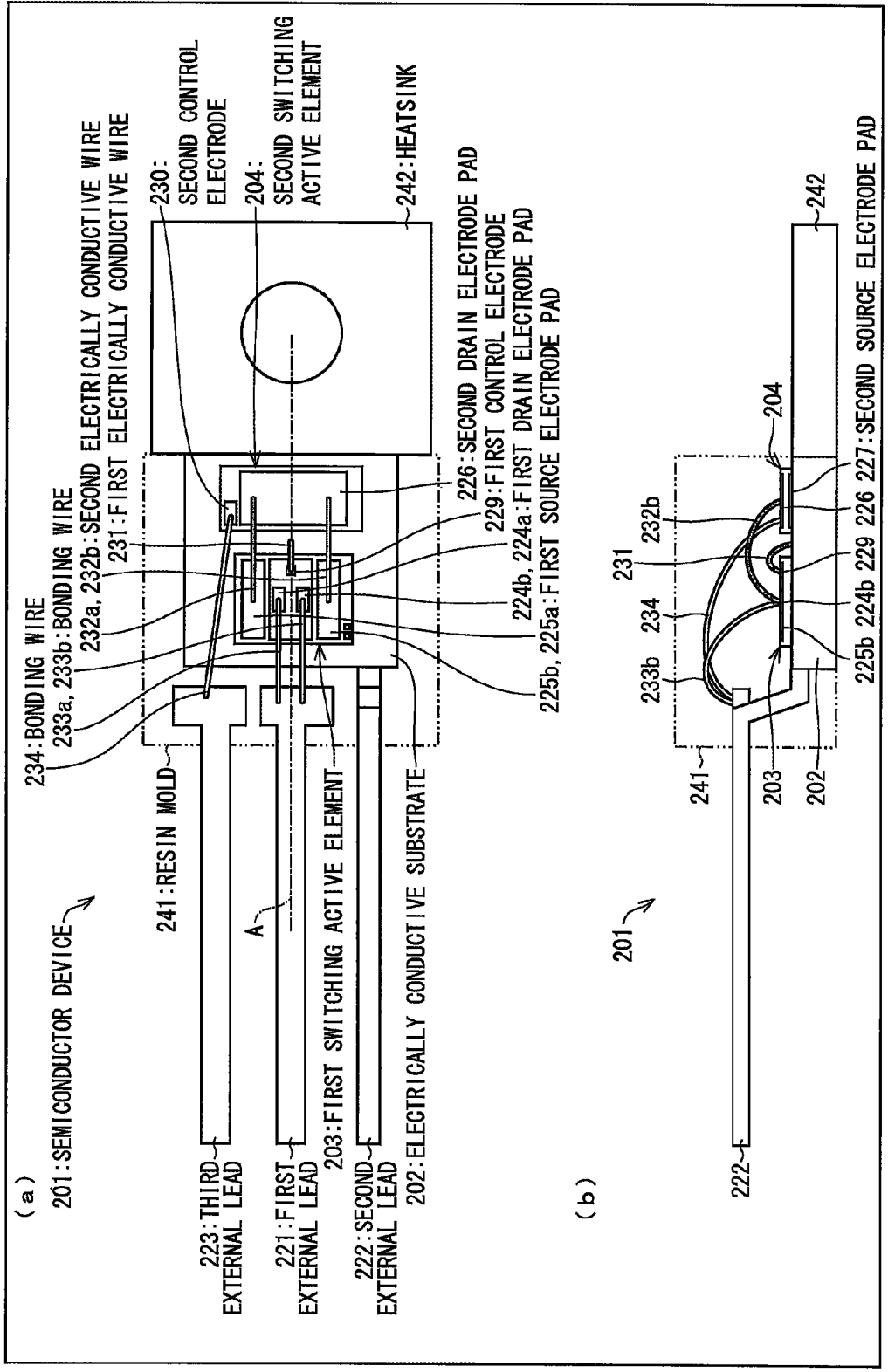

SEMICONDUCTOR DEVICE AND ELECTRONIC APPARATUS

This application is the U.S. national phase of International Application No. PCT/JP2012/074973 filed 27 Sep. 2012 which designated the U.S. and claims priority to JP Patent Application No. 2011-256685 filed Nov. 24, 2011 and JP Patent Application No. 2012-033036 filed 17 Feb. 2012, the entire contents of each of which are hereby incorporated by reference.

TECHNICAL FIELD

The present invention relates to (i) a semiconductor device including a normally-on switching active element and (ii) an electronic device (electronic apparatus) including the semiconductor device.

BACKGROUND ART

In light of a decrease in electric power consumption of home electric appliances, an emphasis has been placed on reducing power loss of semiconductors such as power devices and power modules. In view of the circumstances, semiconductor devices such as power devices employing wide bandgap semiconductors have been developed for the purpose of further reduction in power loss.

Since field-effect transistors (FET), which are made of the III group nitride semiconductor of a GaN (gallium nitride) system, are expected to bring about low on-resistance, various semiconductor devices employing such field-effect transistors have been developed. A known example of the field-effect transistors of a GaN (gallium nitride) system is an AlGaN/GaN HFET (Heterojunction FET) employing a heterostructure in which GaN and AlGaN (aluminum gallium nitride) are combined. Since the AlGaN/GaN HFET has characteristics such as low on-resistance, high-speed performance, high withstand voltage, and high resistance to heat, the AlGaN/GaN HFET has become a focus of attention.

However, the AlGaN/GaN HFET is typically a normally-on field-effect transistor, and is therefore in an on state while a gate voltage is 0V. In order for the AlGaN/GaN HFET to be put in an off state, negative voltage needs to be applied to a gate. Note that, since a power device handles a vast amount of electric current, the power device is required to employ a normally-off field-effect transistor which blocks an electric current while zero bias voltage is applied. This causes a problem that a normally-on field-effect transistor such as the AlGaN/GaN HFET cannot, without any alterations thereto, be used in a power device.

In view of the problem, Patent Literature 1 discloses a semiconductor device in which a normally-off operation is realized by employing a normally-on active element. According to the semiconductor device, a normally-on field-effect transistor and a normally-off field-effect transistor are cascode-connected to each other.

Specifically, according to the semiconductor device, (i) a drain of a first field-effect transistor of a normally-on type is connected to a first node, (ii) a source of a second field-effect transistor of a normally-off type is connected to a second node, and (iii) a switching element is provided between a control electrode of the first field-effect transistor and the second node. While the semiconductor device is in an off state, the switching element operates, by causing the first field-effect transistor to be in an on state, so as to maintain a voltage less than a withstand voltage of the second field-effect transistor. In a case where a voltage across a control electrode reaches or rises higher than a threshold voltage, the switching element allows electric conduction from the first node to the second node.

The semiconductor device configured as such operates as a normally-off transistor which is turned on by applying positive voltage to the control electrode of the second field-effect transistor. Then, by sealing such a semiconductor device in a package such as TO220, it is possible to provide a normally-off field-effect transistor which is high withstand voltage and which is capable of a high-speed operation.

CITATION LIST

Patent Literature

Patent Literature 1

Japanese Patent Application Publication, Tokukai, No. 2011-29386 (Publication Date: Feb. 10, 2011)

SUMMARY OF INVENTION

Technical Problem

However, while the semiconductor device is mounted on an electrically conductive substrate of the package, inherent electrical characteristics of the semiconductor device are subject to influence of parasitic parameters of the package. This may unfortunately impose limitations on specifications of the semiconductor device, depending on a mounting structure of the package.

Examples of the limitations encompass (i) a reduction in speed at which the semiconductor device is switched from an on state to an off state, which reduction is caused by ringing that occurs due to the influence of the parasitic parameters of the package and (ii) electric power loss caused by the parasitic parameters. The parasitic parameters refer to parameters such as (a) a capacitance C, (b) a resistance R, and (c) an inductance L of an electric current path including the transistor, which parameters are not part of a design of the semiconductor device and are determined by a material, a structure, and a layout (arrangements of elements, positions of wires, and the like) of the package.

During the switching from an off state to an on state of the semiconductor device or vice versa, rectangular waves (pulse) of a driving voltage contain harmonics. During high-speed switching, in particular, the pulse has a steep initial rise and therefore contains harmonics with a high frequency. Then, reflection of the harmonics occurs at parts of the semiconductor device where impedance changes due to the parasitic parameters. Then, an accumulation of all the reflected waves (at various frequencies) induces the occurrence of the ringing. While the ringing lasts (and attenuates at the same time), an electric current continues to leak from the electric current path. The leaked electric current results in electric power loss.

In a case where a power source is to be turned on/off with the use of the semiconductor device, in particular, (i) a voltage across the semiconductor device ideally becomes 0 immediately after the semiconductor device is switched off and (ii) occurrence of overshoot to exceed a threshold value is not preferable in light of behaviors of a device to which voltage is to be applied. Therefore, it is crucial to maintain as small ringing as possible.

The extent of the influence of the parasitic parameters on the electrical characteristics of the semiconductor device is determined by a surface area (projected area) of a region inside a loop formed by an electric current path of the semiconductor device when the package of the semiconductor device is viewed in a plan view or in a side view. In other words, the extent is determined by a shape and a length of the electric current path in a three-dimensional space. A smaller area of the region is relative to a smaller extent of the influence of the parasitic parameters on the semiconductor device. Although the surface area of the region in the plan view is the most important factor in the area of the region inside the loop (loop area), the surface area in the side view is also not negligible.

The surface area of the region in the side view is defined by a length of an electrically conductive wire which forms part of the loop and which extends in a height direction with respect to a substrate of the semiconductor device as a reference point. The length of the wire is determined by (i) a thickness (height determined by the specification of the package) of a mold resin (sealing resin) which is stacked on the semiconductor device, (ii) performance of the electrically conductive wire, (iii) conditions under which the semiconductor device is mounted on the package, and the like.

In addition, the loop area of the electric current path also varies, depending on a chip size (length and width of the gate etc.) of the switching active element (transistor). This is because a change in the chip size leads to (i) changes in positions of pads of source, drain, and the like, (ii) changes in positions at which the electrically conductive wire is bonded, and ultimately (iii) a change in the loop area.

The present invention has been made in view of the problem, and it is an object of the present invention to provide a semiconductor device and an electronic device, each of which allows, by reducing a loop area, a reduction in influence of parasitic parameters of a package on electrical characteristics of the semiconductor device.

Solution to Problem

A semiconductor device of the present invention includes: a first switching active element which is of a normally-on type; a second switching active element which is of a normally-off type; and an electrically conductive substrate, the first switching active element and the second switching active element being mounted on the electrically conductive substrate so as to be cascode-connected to each other, the first switching active element and the second switching active element being sealed, the first switching active element having at least one first source electrode pad, a first drain electrode pad, and a first control electrode which are provided on a front surface of the first switching active element, the second switching active element having (i) a second drain electrode pad and a second control electrode which are provided on a front surface of the second switching active element and (ii) a second source electrode pad provided on a back surface of the second switching active element, the back surface being a contact surface in contact with the electrically conductive substrate, the first control electrode being connected to the electrically conductive substrate via a first electrically conductive wire, and the first source electrode pad and the second drain electrode pad being (I) provided in proximity to each other and at a minimum distance therebetween which falls within tolerances of at least (a) mounting precision with which the first switching active element and the second switching active element are mounted on the electrically conductive substrate and (b) connection precision with which the first electrically conductive wire is connected to the electrically conductive substrate and (II) connected to each other via a second electrically conductive wire.

According to the configuration, an electric current path, in which a loop-like electric current flows by a route passing through the first source electrode pad, the second electrically conductive wire, the second drain electrode pad, the second source electrode pad, the electrically conductive substrate, the first electrically conductive wire, and the first control electrode, is formed around the first and second switching active elements which are cascode-connected to each other.

In the electric current path, not only does the second switching active element function as a resistance, but the aforementioned parasitic parameters (capacitance, resistance, inductance) are also present due to the pads and wires. Therefore, the electric current path, when serving as a resonant circuit, causes the occurrence of ringing during switching. A reduction in length of time required for the ringing to cease can be achieved if an attenuation coefficient $\zeta$ (represented by a formula described later) of the resonant circuit is 1 or more. In order to meet such conditions, the inductance of the electric current path needs to be small. In order to achieve a reduction in inductance of the electric current path, a length of a loop of the electric current path needs to be short, that is, the loop area described earlier needs to be small.

According to the semiconductor device of the present invention, the first source electrode pad and the second drain electrode pad are provided in proximity to each other. This allows the second electrically conductive wire, via which the first source electrode pad and the second drain electrode pad are connected, to be short. This causes the loop area to be small, and therefore causes the inductance to be small. Hence, it is possible to reduce the length of time required for the ringing to cease.

Furthermore, adjustment of the length of the first electrically conductive wire allows for adjustment of the resistance of the first electrically conductive wire and therefore allows for control of oscillation of the ringing. By controlling the oscillation of the ringing so as to reduce the inductance of the electric current path, it is possible to reduce the length of time required for the ringing to cease, which ringing occurs in the electric current path.

According to the configuration, (I) the first source electrode pad(s) and second drain electrode pad(s) are each located in linear symmetry with respect to the first electrically conductive wire and (II) the first source electrode pad(s) and second drain electrode pad(s) are connected via the second electrically conductive wire(s) which are arranged in in linear symmetry with respect to the first electrically conductive wire.

Therefore, a plurality of electric current paths, which are formed so as to run through the first source electrode pad and the second drain electrode pads, are in the form of linear symmetry with respect to the first electrically conductive wire serving as an axis of symmetry. This allows a reduction in influence of parasitic parameters of the package on electrical characteristics of the semiconductor device.

Another semiconductor device of the present invention includes: a first switching active element which is of a normally-on type; a second switching active element which is of a normally-off type; and an electrically conductive substrate, the first switching active element and the second switching active element being mounted on the electrically conductive substrate so as to be cascode-connected to each other, the first switching active element and the second switching active element being sealed, the first switching active element having a plurality of first source electrode pads, a plurality of first drain electrode pads, and a first control electrode which are provided on a front surface of the first switching active element, the first drain electrode pads being identical in number to the first source electrode pads, the second switching active element having a plurality of second drain electrode pads, a second control electrode, and a front surface source electrode pad which are provided on a front surface of the second switching active element, the second drain electrode pads being identical in number to the first source electrode pads, each of the first source electrode pads and a corresponding one of the plurality of second drain electrode pads being provided in proximity to each other and at a minimum distance therebetween which falls within tolerance of at least mounting precision with which the first switching active element and the second switching active element are mounted on the electrically conductive substrate, the first control electrode and the front surface source electrode pad being connected to each other via a first electrically conductive wire, the front surface source electrode pad being electrically connected to a second source electrode pad provided on a back surface of the second switching active element, the back surface being a contact surface in contact with the electrically conductive substrate, and the plurality of first source electrode pads being arranged in linear symmetry with respect to the first electrically conductive wire, the plurality of second drain electrode pads being arranged in linear symmetry with respect to the first electrically conductive wire, and the plurality of first source electrode pads and the respective plurality of second drain electrode pads being connected via second electrically conductive wires which are arranged in linear symmetry with respect to the first electrically conductive wire.

According to the configuration, (i) the plurality of first source electrode pads are arranged in linear symmetry with respect to the first electrically conductive wire, (ii) the plurality of second drain electrode pads are arranged in linear symmetry with respect to the first electrically conductive wire, and (iii) the plurality of first source electrode pads and the respective plurality of second drain electrode pads are connected via second electrically conductive wires which are arranged in linear symmetry with respect to the first electrically conductive wire.

Therefore, a plurality of electric current paths, which are formed so as to run through the first source electrode pad and the second drain electrode pads, are arranged in linear symmetry with respect to the first electrically conductive wire serving as an axis of symmetry. This allows a reduction in influence of parasitic parameters of the package on electrical characteristics of the semiconductor device.

According to the configuration, (i) the first switching active element has, on its front surface, the first source electrode pads, the first drain electrode pads identical in number to the first source electrode pads, and the first control electrode and (ii) the second switching active element has, on its front surface, the front surface source electrode pad. In addition, according to the configuration, the first control electrode and the front surface source electrode pad are connected to each other via the first electrically conductive wire.

That is, the first control electrode and the front surface source electrode pad, which are connected via the first electrically conductive wire, are provided on the front surfaces of the first and the second switching elements, respectively. This allows wire bonding to be easily carried out. Therefore, the semiconductor device of the present invention configured as such can be easily mounted. This allows a manufacturing process to be easy and simple.

An electronic device of the present invention includes one of the semiconductor devices described above.

According to the configuration, the semiconductor device, in which the influence of the parasitic parameters of the package on the electrical characteristics is reduced, is used as a switching element of the electronic device. This allows a reduction in length of time required for a voltage to cease fluctuating during a process of switching. Therefore, it is possible to drive the electronic device with stability while reducing electric power consumption.

Advantageous Effects of Invention

Since the semiconductor device of the present invention is configured as described above, it is possible to reduce the loop area of the electric current path(s) that is/are formed in the semiconductor device. Therefore, such an effect can be produced as reducing the influence of the parasitic parameters of the package on the electrical characteristics of the semiconductor device.

BRIEF DESCRIPTION OF DRAWINGS

FIG. 6 is a set of views (a) and (b), (a) of FIG. 6 being a circuit diagram illustrating an equivalent circuit that schematically shows an electric current path that is formed while the semiconductor device illustrated in FIG. 2 is switched on and (b) of FIG. 6 being a circuit diagram illustrated an equivalent circuit that schematically shows an electric current path that is formed while the semiconductor device illustrated in FIG. 2 is switched off.

FIG. 8 is a set of views (a) and (b), (a) of FIG. 8 being a plan view illustrating a configuration of a semiconductor device in accordance with Embodiment 2 of the present invention and (b) of FIG. 8 being a side view illustrating the semiconductor device.

FIG. 10 is a circuit diagram schematically illustrating an electric current path that is formed while the semiconductor device illustrated in (a) of FIG. 8 is switched on.

FIG. 12 is a circuit diagram schematically illustrating an electric current path that is formed while the semiconductor device illustrated in (a) of FIG. 11 is switched on.

DESCRIPTION OF EMBODIMENTS

The following description will discuss embodiments of the present invention in detail with reference to the drawings.

Note that measurements, materials, and shapes of components described in the embodiments, arrangements of the components in relation to one another, and the like are illustrative only, and are not to limit the scope of the present invention thereto, unless particularly stated otherwise.

Embodiment 1

The following description will discuss Embodiment 1 of the present invention with reference to FIGS. 1 through 7.

[Circuit Configuration (Operation) and Circuit Structure of Semiconductor Device]

Figure 1:
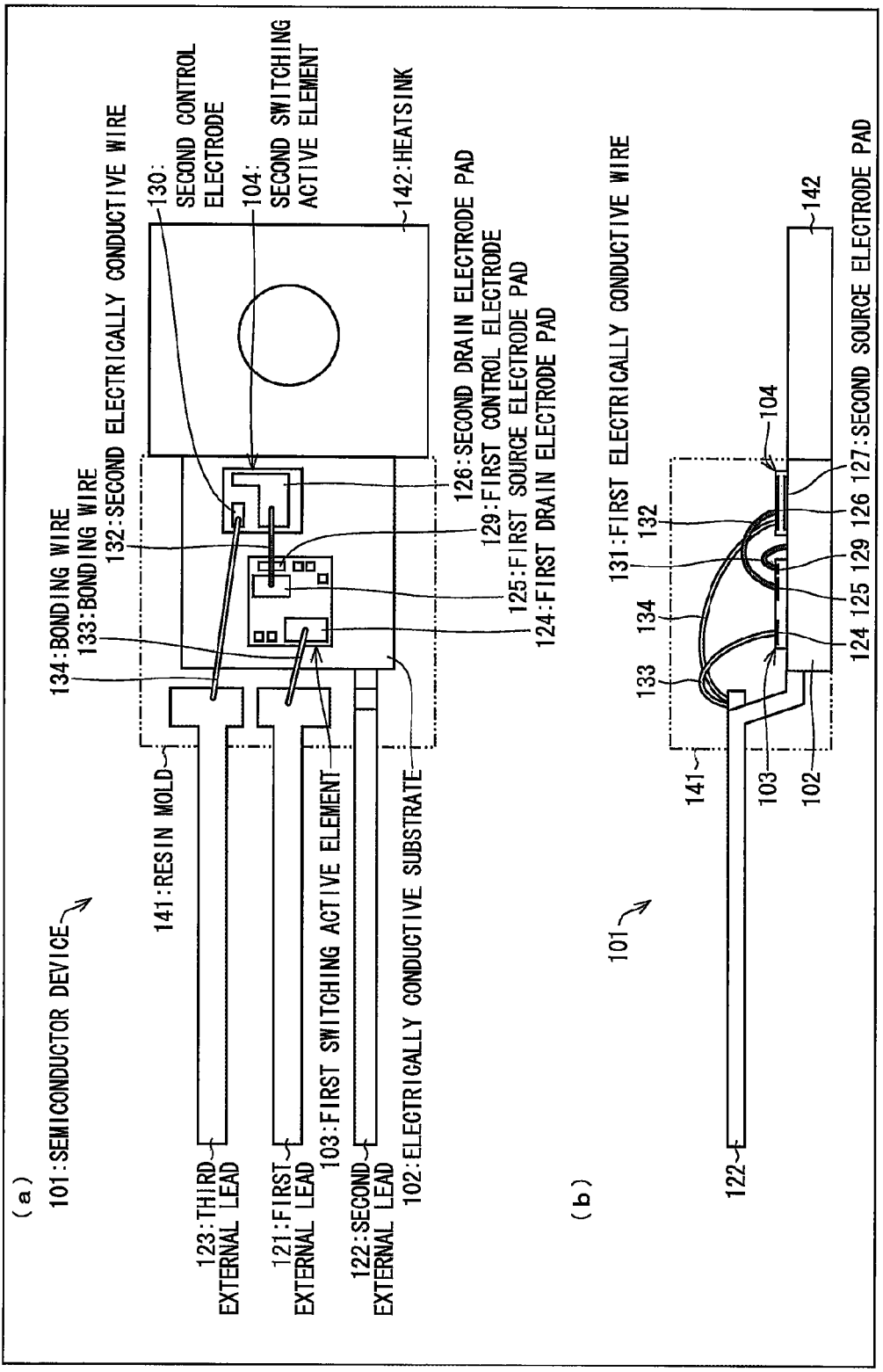
FIG. 1 is a set of views (a) and (b), (a) of FIG. 1 being a plan view illustrating a semiconductor device in accordance with Embodiment 1 of the present invention and (b) of FIG. 1 being a side view illustrating the semiconductor device.
Figure 2:
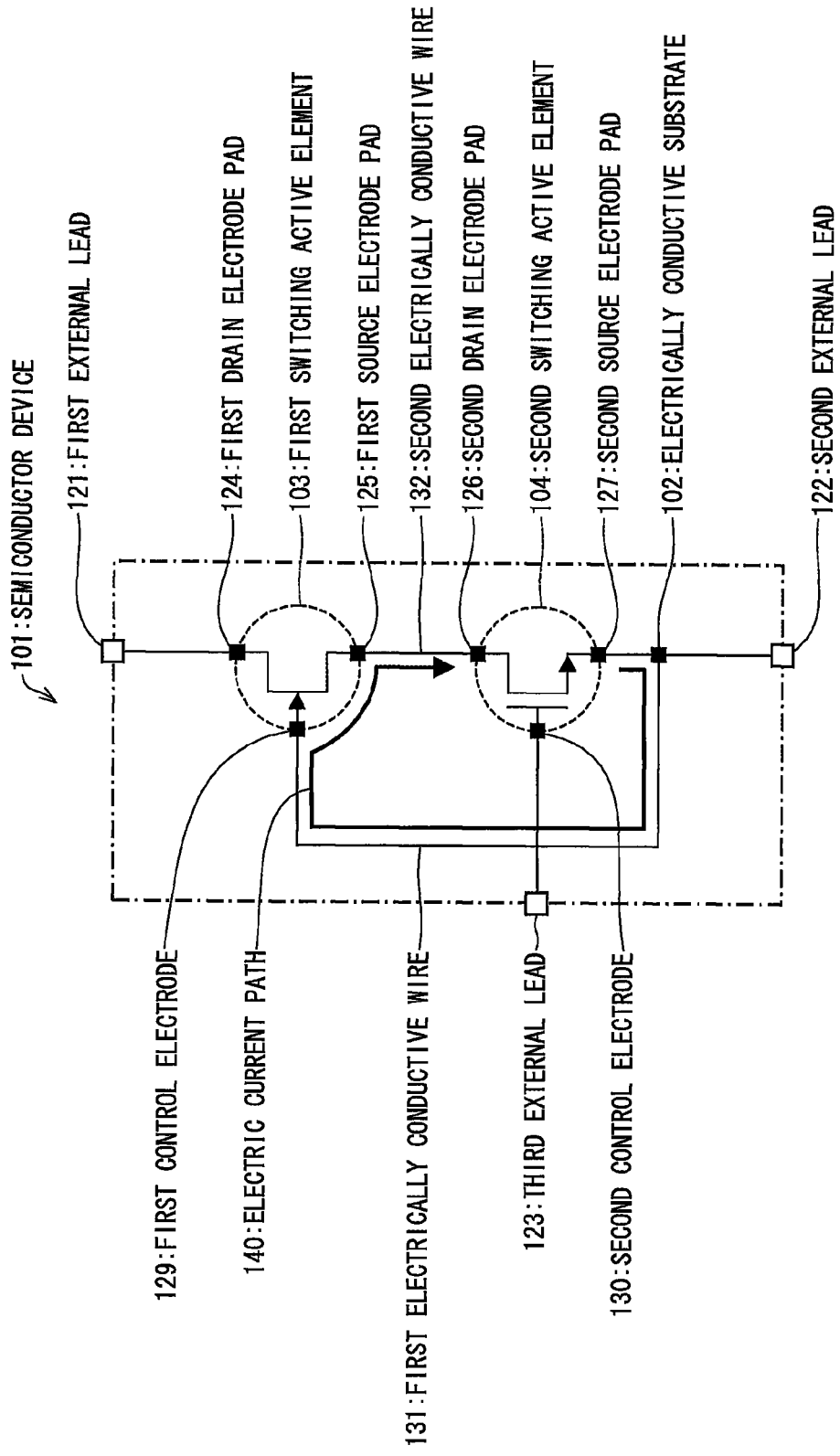
FIG. 2 is a circuit diagram illustrating a circuit configuration of the semiconductor device.

(a) of FIG. 1 is a plan view illustrating a configuration of a semiconductor device 101 in accordance with Embodiment 1 of the present invention. (b) of FIG. 1 is a side view illustrating the configuration of the semiconductor device 101. FIG. 2 is a circuit diagram illustrating a circuit configuration of the semiconductor device 101.

As illustrated in (a) and (b) of FIG. 1, the semiconductor device 101 is configured by a TO220 package having three external leads. The semiconductor device 101 includes (i) an electrically conductive substrate 102, (ii) a first switching active element 103, (iii) a second switching active element 104, (iv) first through third external leads 121 through 123 (respectively), (v) first and second electrically conductive wires 131 and 132 (respectively), (vi) bonding wires 133 and 134, (vii) a resin mold 141, and (viii) a heatsink 142. The semiconductor device 101 includes three external leads which are first through three external leads 121 through 123 (respectively).

As illustrated in FIG. 2, a drain electrode (first drain electrode pad 124) of the first switching active element 103 is connected to the first external lead 121. A source electrode (first source electrode pad 125) of the first switching active element 103 is connected to a drain electrode (second drain electrode pad 126) of the second switching active element 104. A gate electrode (first control electrode 129) of the first switching active element 103 is connected to the second external lead 122 via the electrically conductive substrate 102. A source electrode (second source electrode pad 127) of the second switching active element 104 is also connected to the second external lead 122. A gate electrode (second control electrode 130) of the second switching active element 104 is connected to the third external lead 123.

The first control electrode 129 and the second external lead 122 are connected to each other via a first electrically conductive wire 131 and the electrically conductive substrate 102. The first source electrode pad 125 and the second drain electrode pad 126 are connected to each other via a second electrically conductive wire 132. Such a connection structure will be described in detail later.

The first switching active element 103 is, for example, a field-effect transistor having a GaN layer (i.e. GaN field-effect transistor), and is of a normally-on type. The second switching active element 104 is, for example, a MOS field-effect transistor (MOSFET), and is of a normally-off type.

According to the semiconductor device 101 configured as such, the first switching active element 103 and the second switching active element 104 are cascode-connected to each other. This causes the second switching active element 104 to drive the first switching active element 103, and the semiconductor device 101 therefore operates as a normally-off switching active element.

While a positive control voltage is not applied to the third external lead 123, (i) the normally-off second switching active element 104 is in an off state, and (ii) the normally-on first switching active element 103 is in a steady state with a voltage thereacross corresponding to a zero gate voltage drain current of the second switching active element 104. This state is referred to as an off state of the semiconductor device 101. While a positive control voltage is applied to the third external lead 123, on the other hand, the second switching active element 104 is turned on, and consequently an electric potential of the first source electrode pad 125 decreases. This causes an increase in electric potential of the first control electrode 129, and therefore causes the first switching active element 103 to be turned on. As a result, there is a continuity between the first external lead 121 and the second external lead 122.

While the semiconductor device 101 is in an on state, a loop-like electric current path 140 is formed. In the electric current path 140, an electric current flows by a route passing through the first source electrode pad 125, the second electrically conductive wire 132, the second drain electrode pad 126, the second source electrode pad 127, the electrically conductive substrate 102, the first electrically conductive wire 131, the first control electrode 129, in this order (see an arrow illustrated in FIG. 2).

As illustrated in (a) and (b) of FIG. 1, the entirety of the electrically conductive substrate 102 and respective one ends of the first through third external leads 121 through 123 are covered with the resin mold 141. The respective one ends of the first external lead 121 and the third external lead 123 are provided on the electrically conductive substrate 102 so as to be in close proximity to each other with a predetermined distance therebetween. The second external lead 122 is connected to the electrically conductive substrate 102.

The heatsink 142, which is integral with the electrically conductive substrate 102, is provided in such a manner as to extend out of the resin mold 141. The heatsink 142 is provided so as to cause heat, which has been radiated from the first switching active element 103 and the second switching active element 104 that are provided on the electrically conductive substrate 102, to be dissipated out of the semiconductor device 101.

On the electrically conductive substrate 102, the first switching active element 103 and the second switching active element 104 are provided.

The first drain electrode pad 124, the first source electrode pad 125, and the first control electrode 129 are provided on a surface (hereinafter referred to as "front surface") of the first switching active element 103, which surface is opposite a contact surface in contact with the electrically conductive substrate 102. The second drain electrode pad 126 and the second control electrode 130 are provided on a surface (hereinafter referred to as "front surface") of the second switching active element 104 which surface is opposite a contact surface in contact with the electrically conductive substrate 102. The second source electrode pad 127 is provided on the contact surface (hereinafter referred to as "back surface") of the second switching active element 104.

On the electrically conductive substrate 102, the first source electrode pad 125 and the second drain electrode pad 126 are provided so that their respective one sides, which are located closest to each other, face each other. The first drain electrode pad 124 and the first external lead 121 are connected to each other via the bonding wire 133. The second control electrode 130 and the third external lead 123 are connected to each other via the bonding wire 134.

The first source electrode pad 125 and the second drain electrode pad 126 are connected to each other via the second electrically conductive wire 132. The first control electrode 129 and the electrically conductive substrate 102 connected to each other via the first electrically conductive wire 131.

As has been described above, the semiconductor device 101 is configured so that the first source electrode pad 125 and the second drain electrode pad 126 are provided so as to be as close to each other as possible. This allows the second electrically conductive wire 132, which permits connection between the pads, to be short. Meanwhile, a height of wiring of the semiconductor device 101 is determined under the restrictions such as a thickness of the resin mold 141, performance of the wires, mounting conditions, and the like. Hence, provision of the second electrically conductive wire 132 at a height reduced within these restrictions allows for a smaller loop area of the electric current path 140. This allows a reduction in influence of parasitic parameters on electrical characteristics of the semiconductor device 101.

According to the semiconductor device 101, in order to cause the first source electrode pad 125 and the second drain electrode pad 126 to be located in proximity to each other as described above, the first switching active element 103 and the second switching active element 104 are provided apart from each other at a minimum distance therebetween, which minimum distance still meets constraint conditions. This causes a distance between the first source electrode pad 125 and the second drain electrode pad 126 to be as small as possible. Examples of the constraint conditions encompass (i) bonding precision of a device (die-bonder) in die-bonding the first switching active element 103 and the second switching active element 104 onto the electrically conductive substrate 102, (ii) an extent to which a die-bonding material (such as solder, silver paste, or epoxy) spreads out after the die-bonding, and (iii) bonding precision (connection precision) of a device (wire bonder) in bonding the first electrically conductive wire 131 onto the electrically conductive substrate 102. Note that the minimum distance is a distance that falls within a tolerance of such constraint conditions while still serving as a minimum distance (space) between the first switching active element 103 and the second switching active element 104.

In the plan view of the semiconductor device 101 illustrated in (a) of FIG. 1, the first electrically conductive wire 131 is provided so as to be concealed directly under the second electrically conductive wire 132 as well as to overlap the second electrically conductive wire 132. Therefore, the first control electrode 129 is located closer to the second switching active element 104 than to the first source electrode pad 125.

Hence, according to the semiconductor device 101, the loop area of the electric current path 140 in the plan view is nearly non-existent. Therefore, the semiconductor device 101 makes it possible to minimize the influence of the parasitic parameters on the electrical characteristics thereof.

[Modification]

A modification of the Embodiment 1 will be described below.

Figure 3:
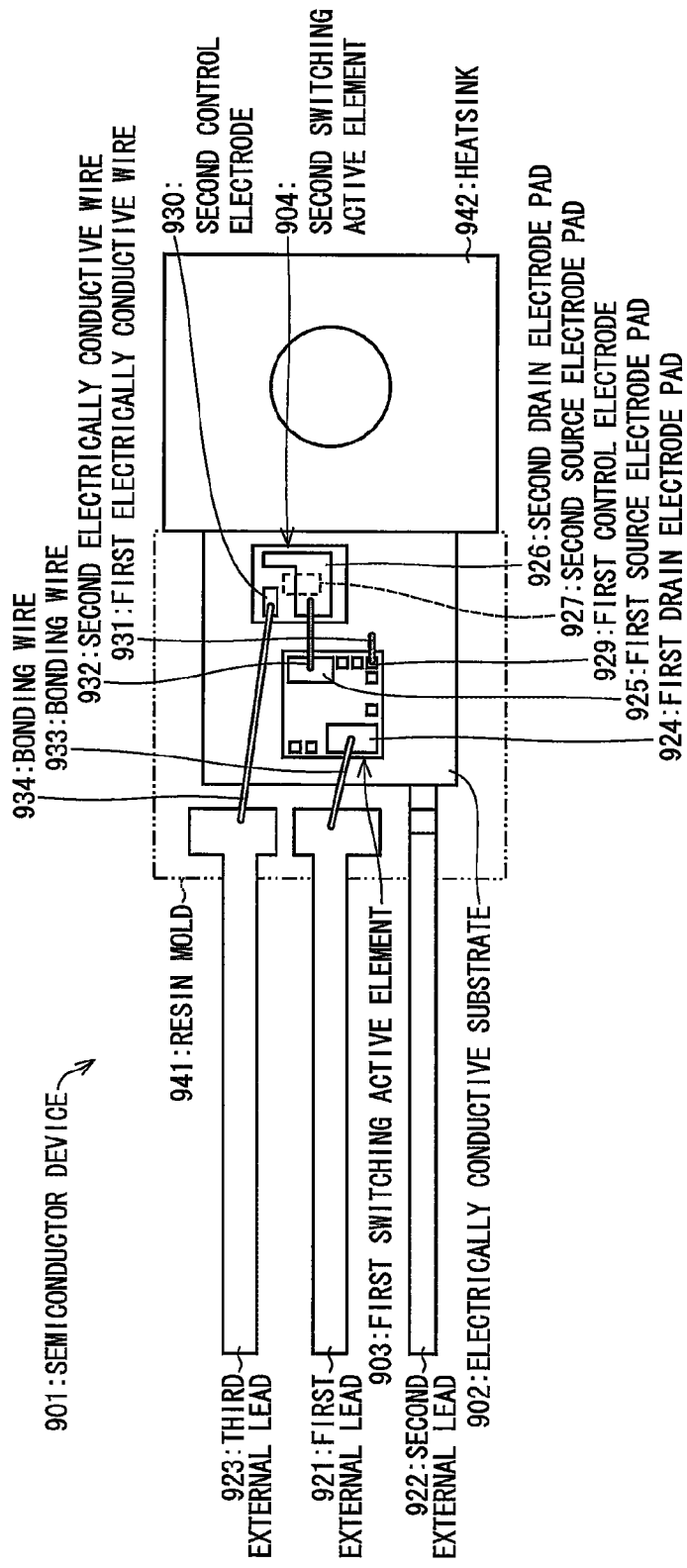
FIG. 3 is a plan view illustrating a configuration of a semiconductor device in accordance with a modification of Embodiment 1.
Figure 4:
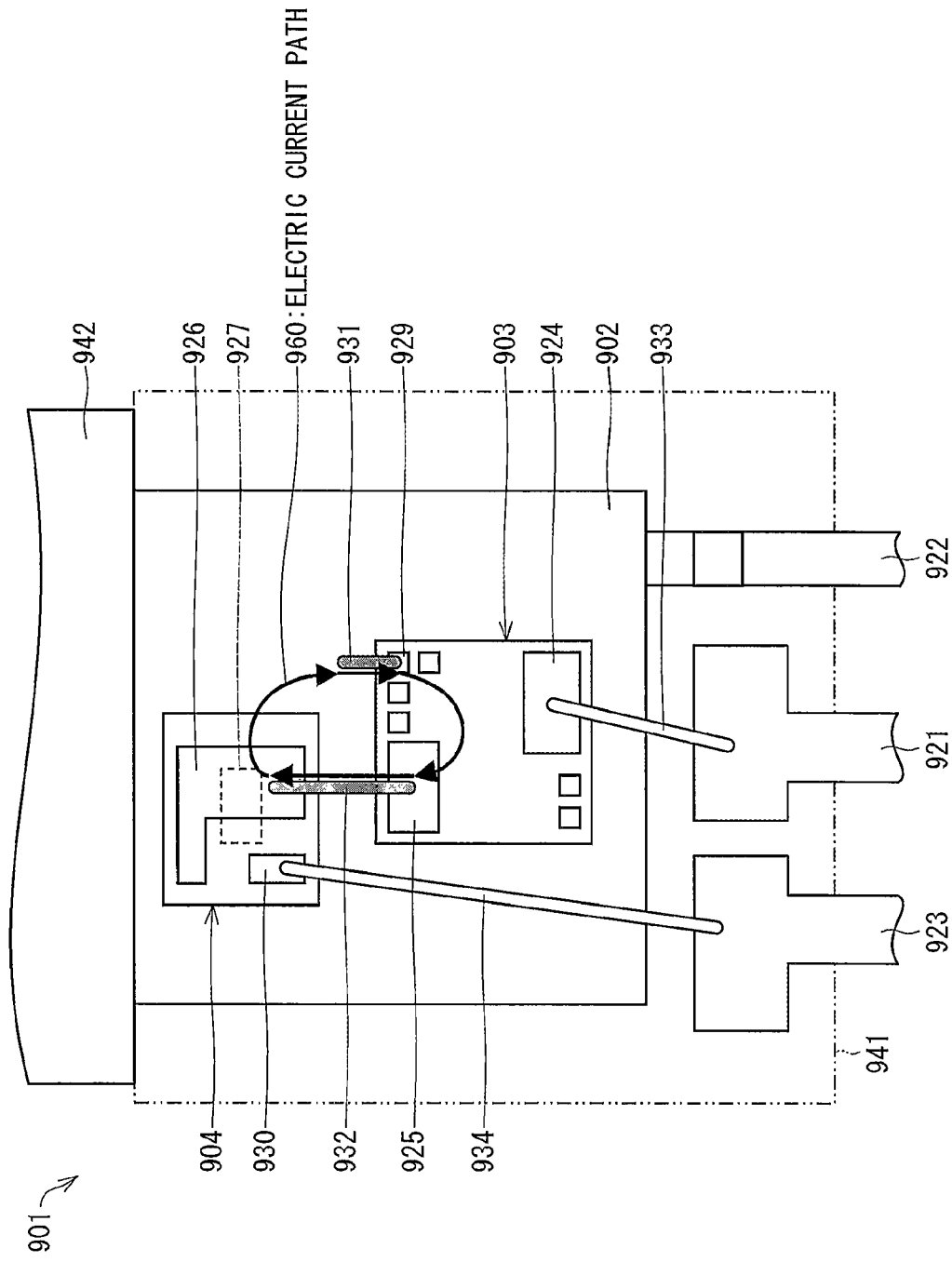
FIG. 4 is an enlarged, plan view illustrating main components of the semiconductor device illustrated in FIG. 3.

FIG. 3 is a plan view illustrating a configuration of a semiconductor device 901 in accordance with the modification. FIG. 4 is an enlarged, plan view illustrating main parts of the semiconductor device 901.

As is the case of the semiconductor device 101, the semiconductor device 901 is configured by a TO220 package (see FIG. 3). The semiconductor device 901 includes (i) an electrically conductive substrate 902, (ii) a first switching active element 903, (iii) a second switching active element 904, (iv) first through third external leads 921 through 923 (respectively), (v) first and second electrically conductive wires 931 and 932 (respectively), (vi) bonding wires 933 and 934, (vii) a resin mold 941, and (viii) a heatsink 942. Of these parts, the second switching active element 904, the first through third external leads 921 through 923, the bonding wires 933 and 934, the resin mold 941, and the heatsink 942 are similar in function to the second switching active element 104, the first through third external leads 121 through 123, the bonding wires 133 and 134, the resin mold 141, and the heatsink 142 of the semiconductor device 101, respectively. The first drain electrode pad 924 and the second control electrode 930 are also similar in function to the first drain electrode pad 124 and the second control electrode 130, respectively.

According to the semiconductor device 901, the first electrically conductive wires 931 permits connection between the first control electrode 929 and the electrically conductive substrate 902, and the second electrically conductive wire 932 permits connection between a first source electrode pad 925 and a second drain electrode pad 926. This forms, in the semiconductor device 901, an electric current path 960 in which an electric current flows through the first source electrode pad 925, the second electrically conductive wires 932, the second drain electrode pad 926, a second source electrode pad 927, the electrically conductive substrate 902, the first electrically conductive wires 931, and the first control electrode 929 (see FIG. 3).

Unlike the first switching active element 103, the first switching active element 903 is configured so that the first control electrode 929 is located so as to be away from the first source electrode pad 925 and to be closer to the side of the second external lead 922 illustrated in FIG. 3. This causes the first electrically conductive wire 931 to be located so as to be away from the second electrically conductive wire 932 and to be closer to the side of the second external lead 922. Therefore, unlike the case of the first electrically conductive wire 131 and the second electrically conductive wire 132, the first electrically conductive wires 931 and the second electrically conductive wires 932 are not to overlap each other in the plan view of the semiconductor device 901.

Therefore, a loop area of an electric current path 60 is larger than that of the electric current path 140. Therefore, the semiconductor device 901 is subject to a greater influence of parasitic parameters on electrical characteristics thereof than the semiconductor device 101 is. However, since the first source electrode pad 925 is provided closer to the second switching active element 904 than the first source electrode pad 125 to the second switching active element 104, it is possible to cause the second electrically conductive wire 932 to be shorter than the second electrically conductive wire 132. With the second electrically conductive wire 932, the semiconductor device 901 is subject to a smaller influence of the parasitic parameters on the electrical characteristics than the semiconductor device 101 is.

Comparative Example

Next, a comparative example of Embodiment 1 will be described.

Figure 5:
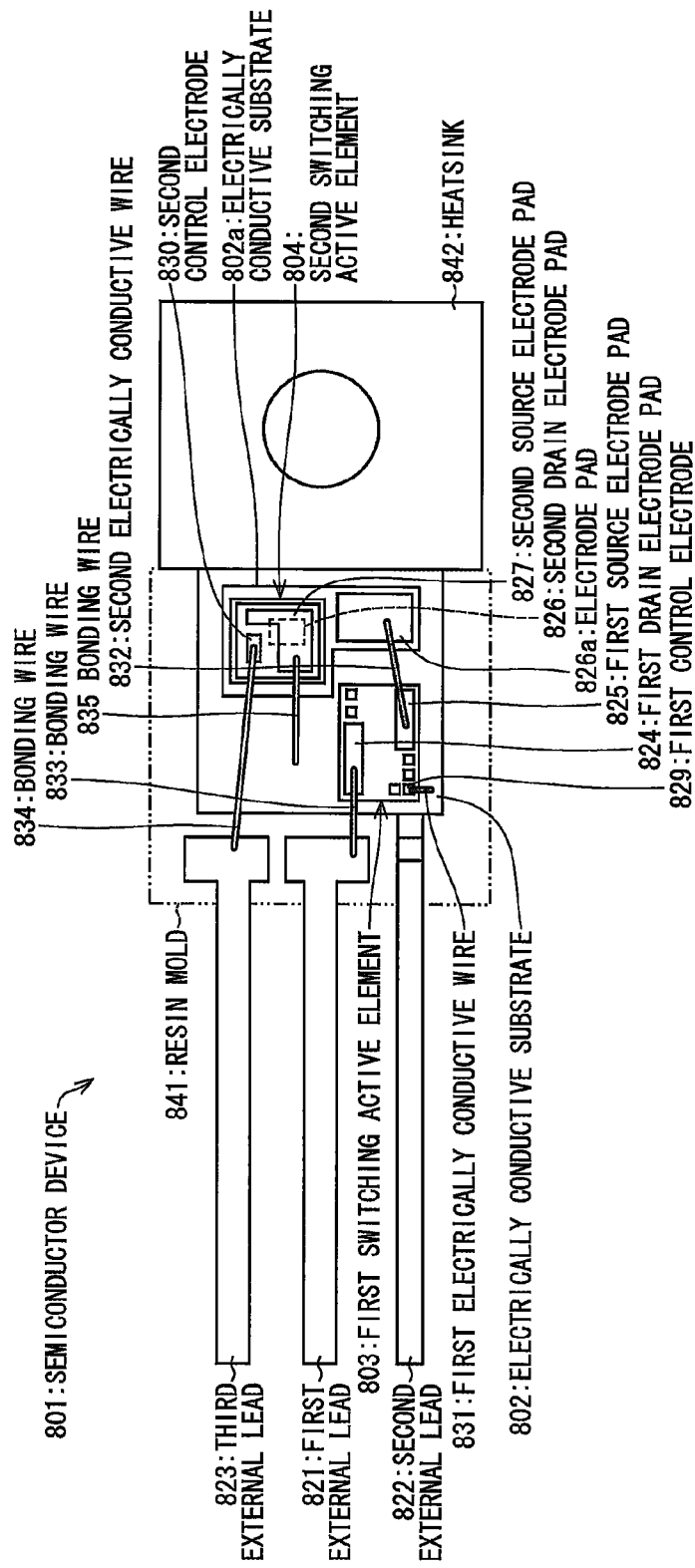
FIG. 5 is a plan view illustrating a configuration of a semiconductor device in accordance with a comparative example of Embodiment 1.

FIG. 5 is a plan view illustrating a configuration of a semiconductor device 801.

As is the case of the semiconductor device 101, the semiconductor device 801 is configured by a TO220 package (see FIG. 5). The semiconductor device 801 includes (i) electrically conductive substrates 802 and 802a, (ii) a first switching active element 803, (iii) a second switching active element 804, (iv) first through second external leads 821 through 823 (respectively), (v) first and second electrically conductive wires 831 and 832 (respectively), (vi) bonding wires 833 and 834, (vii) a resin mold 841, and (viii) a heatsink 842. Of these parts, the first through second external leads 821 through 823, the bonding wires 833 and 834, the resin mold 841 and the heatsink 842 are similar in function to the first through third external leads 121 through 123, the bonding wires 133 and 134, the resin mold 141, and the heatsink 142 of the semiconductor device 101.

The first switching active element 803 has a structure identical to that of the first switching active element 903 of the semiconductor device 901, except that the location of the first switching active element 803 is different from that of the first switching active element 903.

The second switching active element 804 is mounted on the electrically conductive substrate 802a, which is provided on the electrically conductive substrate 802 such that the electrically conductive substrate 802a is insulated from the electrically conductive substrate 802 at its surface mating with the electrically conductive substrate 802. A second source electrode pad 827 and a second control electrode 830 are provided on a front surface of the second switching active element 804. Unlike the case of the second switching active element 104 of the semiconductor device 101, the second drain electrode pad 826 is provided on a back surface of the second switching active element 804 so as to be attached to an electrically conductive layer of a front surface of the electrically conductive substrate 802a. This causes an electric potential, which is identical to a drain potential of the second switching active element 804, to occur at an electrode pad 826a that has a continuity with the electrically conductive layer of the front surface of the electrically conductive substrate 802a.

According to the semiconductor device 801, (i) the first electrically conductive wire 831 permits connection between a first control electrode 829 and the electrically conductive substrate 802 and (ii) the second electrically conductive wire 832 permits connection between a first source electrode pad 825 and the electrode pad 826a. This forms, in the semiconductor device 801, an electric current path in which an electric current flows through the first source electrode pad 825, the second electrically conductive wire 832, the electrode pad 826a, the second drain electrode pad 826, the second source electrode pad 827, the bonding wire 835, the electrically conductive substrate 802, the first electrically conductive wire 831, and the first control electrode 829.

Unlike the first switching active element 103, the first switching active element 803 is configured so that there is a large distance between the second electrically conductive wires 832 and the bonding wire 835. This causes a loop area of the electric current path to be larger than that of the electric current path 140.

[Relationship Between Ringing and Attenuation Constant]

The following description will discuss a relationship between the loop area of the electric current path 140 and the attenuation of ringing.

(a) of FIG. 6 is a circuit diagram illustrating an equivalent circuit of the electric current path 140 while the semiconductor device 101 is switched on. (b) of FIG. 6 is a circuit diagram illustrating an equivalent circuit of the electric current path 140 while the semiconductor device 101 is switched off.

As illustrated in (a) and (b) of FIG. 6, the electric current path 140 illustrated in FIG. 3 contains a capacitance C and an inductance L thereof. The second switching active element 104 of the electric current path 140 functions as an equivalent to a resistance R1 while the second switching active element 104 is switched on. This causes an RLC resonant circuit to be formed, as illustrated in (a) of FIG. 6, while the electric current path 140 is switched off. On the other hand, the second switching active element 104 functions as an equivalent to a capacitance C1 while the second switching active element 104 is switched off. Furthermore, in the semiconductor device 101, there exist the parasitic parameters (capacitance, resistance, and inductance) which are caused by the pads and wires.

Therefore, the electric current path 140 can be regarded as forming an RLC resonant circuit (serial resonance circuit) (see (a) of FIG. 6).

An operation of the RLC resonant circuit will be described below.

An attenuation coefficient $\zeta$ of the RLC resonant circuit is represented by the following formula:

$$\zeta = (R/2)\sqrt{(C/L)}$$

where R, L, and C indicate resistance, inductance, and capacitance, respectively. In a case where the attenuation coefficient $\zeta$ is 1 or more, an oscillation of the electric current path 140 can be prevented. It is also known that the larger attenuation coefficient $\zeta$, the more rapidly ringing having occurred in the electric current path 140 decays (attenuates).

As is clear from the above formula, an inductance L of the RLC resonant circuit needs to be as small as possible in order to prevent the occurrence of oscillation and to rapidly attenuate the ringing. The inductance L can be made small by shortening the length of the loop (i.e. by reducing the loop area) of the electric current path 140.

Hence, it can be understood that the attenuation of ringing in a minimum amount of time can be achieved by reducing the loop area of an electric current path to a minimum.

[Voltage Change During Switching]

Figure 7:
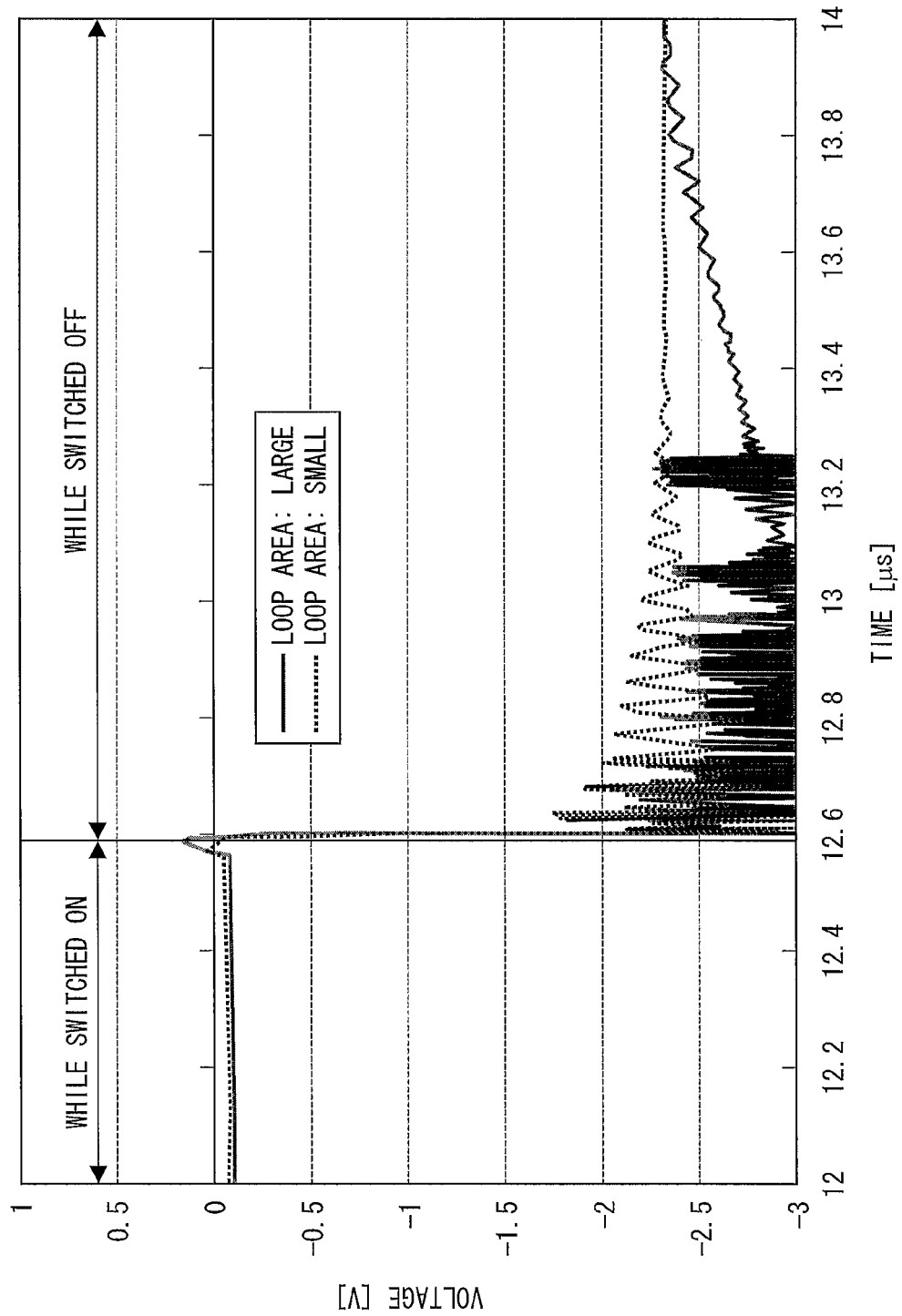
FIG. 7 is a graph showing changes over time in voltage across first control electrodes of first switching active elements while the respective semiconductor devices illustrated in FIG. 1 and FIG. 5 are switched off.

FIG. 7 is a graph showing a simulated change over time in voltage across the first control electrode 129 of the semiconductor device 101 while the semiconductor device 101 is switched off.

For comparison, FIG. 7 also shows results of comparable simulation carried out on a semiconductor device (semiconductor device 801 illustrated in FIG. 5 according to Comparative Example) which has a larger loop area of the electric current path than that of the semiconductor device 101.

As illustrated in FIG. 7, a length of delay time before the semiconductor device 101 (dotted line) becomes stable at off-voltage after being switched off is approximately half of a length of delay time before the semiconductor device 801 (solid line) does. This indicates a reduction in ringing that occurs in the semiconductor device 101. An electric current leaks from the electric current path 140 during a period in which the ringing occurs, attenuates, and then completely discontinues. Therefore, a reduction in such a period allows a reduction in electric power loss.

According to the semiconductor device 101 configured as above, the influence of the parasitic parameters on the electrical characteristics is thus reduced.

[Method for Manufacturing Semiconductor Device]

As described earlier, the semiconductor device 101 is manufactured by (i) mounting the first switching active element 103 and the second switching active element 104 on the electrically conductive substrate 102 of the package (TO220 package) and then (ii) carrying out wiring of the first switching active element 103 and the second switching active element 104.

The following description will discuss each of steps (1) through (5), in this order, which are involved in a method of manufacturing (producing) the semiconductor device 101. Note that only a brief description will be provided of steps which are not closely related to the distinctive feature of the present invention and which are encompassed in the scope of well-known technologies.

(1) A first switching active element 103 and a second switching active element 104 are provided on an electrically conductive substrate 102 as illustrated in (a) of FIG. 1. In so doing, a first source electrode pad 125 of the first switching active element 103 and a second drain electrode pad 126 of the second switching active element 104 are located as close to each other as possible within such limits that problems such as a short circuit would not be encountered.

(2) A first control electrode 129 and a first external lead 121 are connected to each other via a bonding wire 133. A second control electrode 130 and a third external lead 123 are connected to each other via a bonding wire 134. The bonding wires 133 and 134 are, for example, electrically conductive wires made of aluminum.

(3) A first control electrode 129 and the electrically conductive substrate 102 are connected to each other via a first electrically conductive wire 131. In so doing, an imaginary line on which to provide a second electrically conductive wire 132 is predetermined, and the first electrically conductive wire 131 is provided at a position parallel to the imaginary line so that the first electrically conductive wire 131 is on a lower level than the imaginary line.

(4) The first source electrode pad 125 and the second drain electrode pad 126 are connected to each other via the second electrically conductive wire 132. The second electrically conductive wire 132 is provided so as to be perpendicular, in the plan view, to a direction in which the first source electrode pad 125 and the second drain electrode pad 126 face each other. In so doing, the second electrically conductive wire 132 preferably has a length as short as possible when the package is viewed from above. Note that the second electrically conductive wire 132 is provided so as to be located over the first electrically conductive wire 131 which was provided in the step (3).

(5) The second control electrode 130 and the third external lead 123 are connected to each other via the bonding wire 134. The first drain electrode pad 124 and the first external lead 121 are connected to each other via the bonding wire 133. Finally, a sealing region including the electrically conductive substrate 102 is sealed with a resin mold 141.

The semiconductor device 101 is thus completed through the above steps.

Embodiment 2

Figure 10:
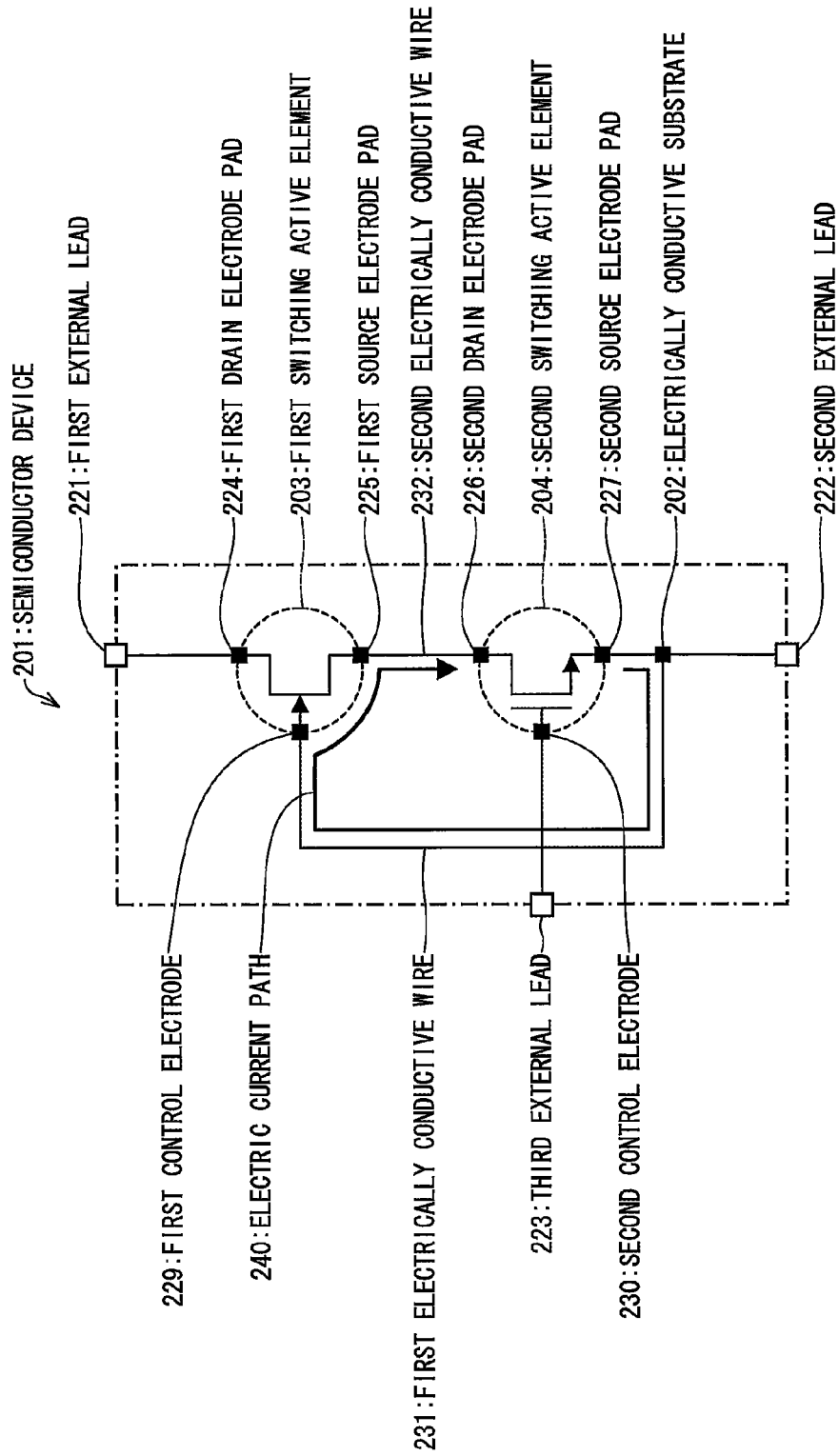

The following description will discuss Embodiment 2 of the present invention with reference to (a) and (b) of FIG. 8 and FIG. 10.

(a) of 8 is a plan view illustrating a configuration of a semiconductor device 201 in accordance with Embodiment 2 of the present invention. (b) of FIG. 8 is a side view of the semiconductor device 201.

As is the case of the semiconductor device 101, the semiconductor device 201 is configured by a TO220 package (see (a) and (b) of FIG. 8). The semiconductor device 201 includes (i) an electrically conductive substrate 202, (ii) a first switching active element 203, (iii) a second switching active element 204, (iv) first through third external leads 221 through 223 (respectively), (v) a first electrically conductive wire 231, (vi) second electrically conductive wires 232a and 232b, (vii) bonding wires 233a and 233b, (viii) a bonding wire 234, (ix) a resin mold 241, and (x) a heatsink 242. Of these parts, the first through third external leads 221 through 223, the bonding wire 234, the resin mold 241, and the heatsink 242 are similar in function to the first through third external leads 121 through 123, the bonding wire 134, the resin mold 141, and the heatsink 142 of the semiconductor device 101, respectively. Therefore, these parts will not be described in detail below.

Unlike the first switching active element 103, the first switching active element 203 includes (i) two of first source electrode pads, which are first source electrode pads 225a and 225b and (ii) two of first drain electrode pads, which are first drain electrode pads 224a and 224b. The first switching active element 203 further includes a first control electrode 229.

The first source electrode pads 225a and 225b are arranged in symmetry with respect to a center line A of the first external leads 221. The first drain electrode pads 224a and 224b are (i) provided between the first source electrode pads 225a and 225b and (ii) arranged in symmetry with respect to the center line A. The first control electrode 229 is provided on the center line A, which part is located in proximity to the second switching active element 204.

The second switching active element 204 includes a second drain electrode pad 226, a second source electrode pad 227, and a second control electrode 230. The second drain electrode pad 226 (i) has a (rectangular) shape that is symmetrical with respect to the center line A and (ii) is provided so as to occupy the majority of a front surface of the second switching active element 204. The second source electrode pad 227 is provided on a contact surface (surface opposite the front surface) in contact with the electrically conductive substrate 202. The second control electrode 230 is provided on a part of the front surface of the second switching active element 204, which part is located in proximity to the third external leads 223.

The bonding wires 233a and 233b are each provided parallel to the center line A. The first drain electrode pads 224a and 224b are connected to the first external leads 221 via the bonding wires 233a and 233b, respectively. The second control electrode 230 and the third external leads 223 are connected to each other via the bonding wire 234.

The first control electrode 229 and the electrically conductive substrate 202 are connected to each other via the first electrically conductive wire 231. The first source electrode pad 225a and the second drain electrode pad 226 are connected to each other via the second electrically conductive wire 232a. The first source electrode pad 225b and the second drain electrode pad 226 are connected to each other via the second electrically conductive wire 232b.

According to the semiconductor device 201, therefore, (i) a first electric current path is formed in which an electric current flows through the first source electrode pad 225a, the second electrically conductive wire 232a, the second drain electrode pad 226, the second source electrode pad 227, the electrically conductive substrate 202, the first electrically conductive wire 231, and the first control electrode 229 and (ii) a second electric current path is formed in which an electric current flows through the first source electrode pad 225b, the second electrically conductive wire 232b, the second drain electrode pad 226, the second source electrode pad 227, the electrically conductive substrate 202, the first electrically conductive wire 231, and the first control electrode 229.

According to the semiconductor device 201 configured as such, the first source electrode pads 225a and 225b and the second drain electrode pad 226 are provided in close proximity to each another. This allows the second electrically conductive wires 232a and 232b to be short.

According to the semiconductor device 201, the first switching active element 203 and the second switching active element 204 are provided as close to each other as possible so as to be at a minimum distance therebetween, which minimum distance still meets constraint conditions, so that (i) the first source electrode pads 225a and 225b and (ii) the second drain electrode pad 226, are located in proximity to each other as described above. Examples of the constraint conditions encompass (a) bonding precision of a device (die-bonder) in die-bonding the first and second switching active elements 203 and 204 to the electrically conductive substrate 202, (b) an extent to which a die-bonding material (such as solder, silver paste, or epoxy) spreads out after the die-bonding, and (c) bonding precision (connection precision) of a device (wire bonder) in bonding the first electrically conductive wire 231 to the electrically conductive substrate 202. Note that the minimum distance is a distance that falls within tolerance of such constraint conditions while still serving as a minimum distance (space) between the first and second switching active element 203 and 204.

[Electric Current Path and Circuit Diagram]

FIG. 10 is a circuit diagram illustrating an electric current path 240 to be formed in the semiconductor device 201.

According to the semiconductor device 201, the electric current path 240 is to be formed as a first or second electric current path. The electric current path 240, which is illustrated as a single electric current path in FIG. 10 for convenience, can be regarded as any one of the first and second electric current paths. A loop area of the first electric current path is the same as that of the second electric current path due to the symmetrical arrangement of the wires described above.

If the first control electrode 229 was provided to be out of the center line A, the first electric current path and the second electric current path would be asymmetrical with respect to the center A. In such a case, the loop area of one of the first electric current path and the second electric current path would be larger than that of the other. This would cause the electrical characteristics to be susceptible to the parasitic parameters.

For example, if the first control electrode 229 was provided outside a region between the first source electrode pads 225a and 225b instead of being provided inside the region, then the first electrically conductive wire 231 would be located outside a region between the second electrically conductive wires 232a and 232b instead of being provided inside the region. In such a case, the first electric current path and the second electric current path would be asymmetrical with respect to the center A. This would cause imbalance between the loop areas, and would therefore pose the problem of the susceptibility of the electrical characteristics to the parasitic parameters.

Furthermore, in the above case, the following problem would be conceivable: The first electrically conductive wire 231, which is shared by the first and second electric current paths, is provided on the center line A. Therefore, application of voltage across the first electrically conductive wire 231 would not cause any trouble with the functionality of the circuit. However, since the first and second electric current paths 240 would be thus asymmetrical with respect to the center line A, the application of voltage across the first electrically conductive wire 231 could induce an unexpected vibration due to a difference in resonant frequency between the first and second electric current paths 240.

The semiconductor device 201 of Embodiment 2 is thus configured to secure the symmetry of the wiring. This allows a reduction in the influence of the parasitic parameters of the package on the electrical characteristics.

Note that the semiconductor device 201 can have three or more electric current paths by utilizing the configuration of Embodiment 2.

In such a case, (i) the first switching active element 203 includes three or more first source electrode pads and three or more first drain electrode pads, (ii) the number of second electrically conductive wires, via which the first source electrode pads and the corresponding second drain electrode pads are connected, is the same as the number of the first source electrode pad, and (iii) the second electrically conductive wires are arranged (a) in symmetry with respect to the center line A and (b) parallel to the center line A. Note, however, that in a case where an odd number of second electrically conductive wires are provided, one of them is to be provided on the center line A Embodiment 3

Figure 11:
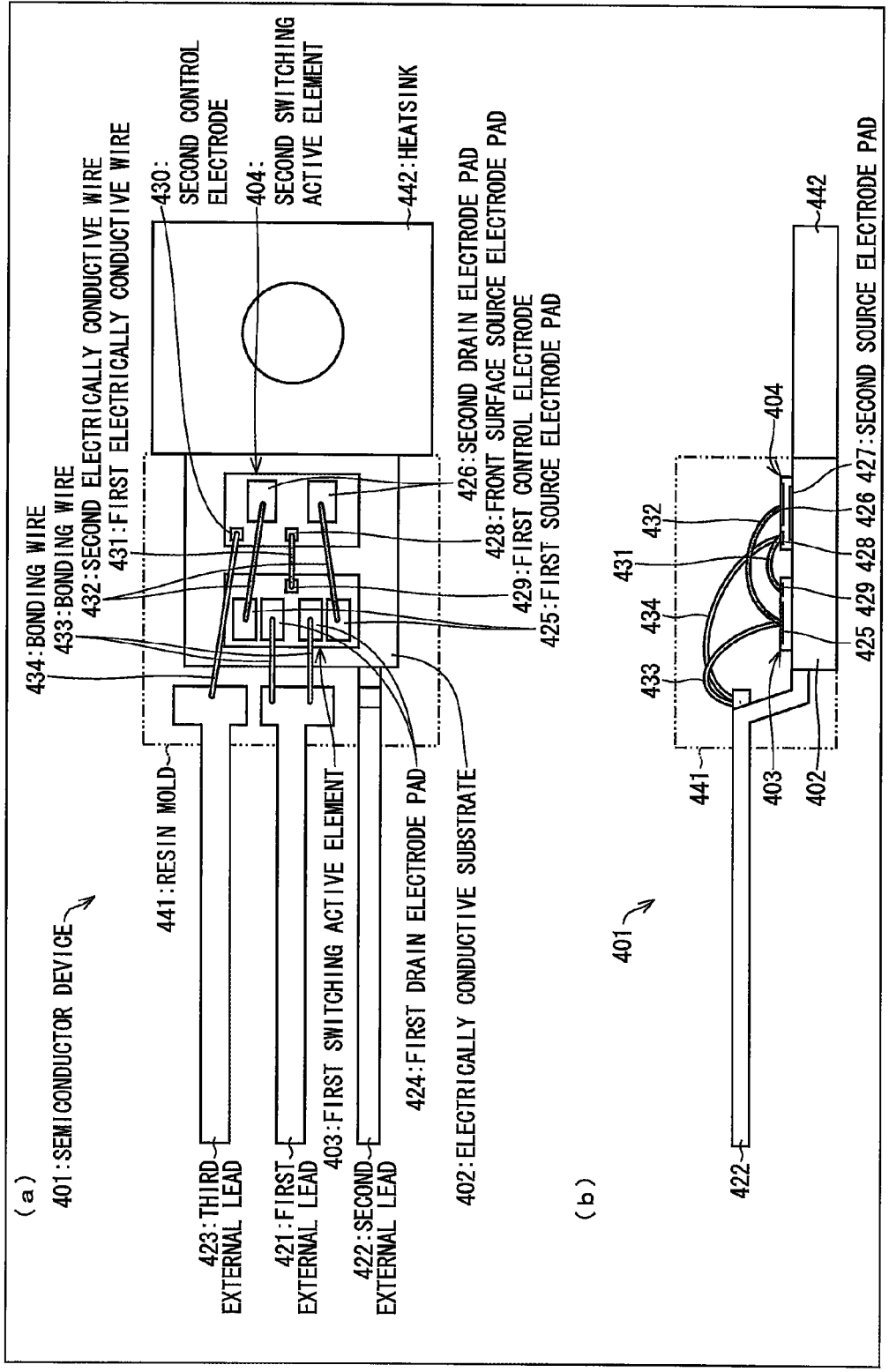
FIG. 11 is a set of views (a) and (b), (a) of FIG. 11 being a plan view illustrating a configuration of semiconductor device in accordance with Embodiment 3 of the present invention and (b) of FIG. 11 being a side view illustrating the semiconductor device.
Figure 12:
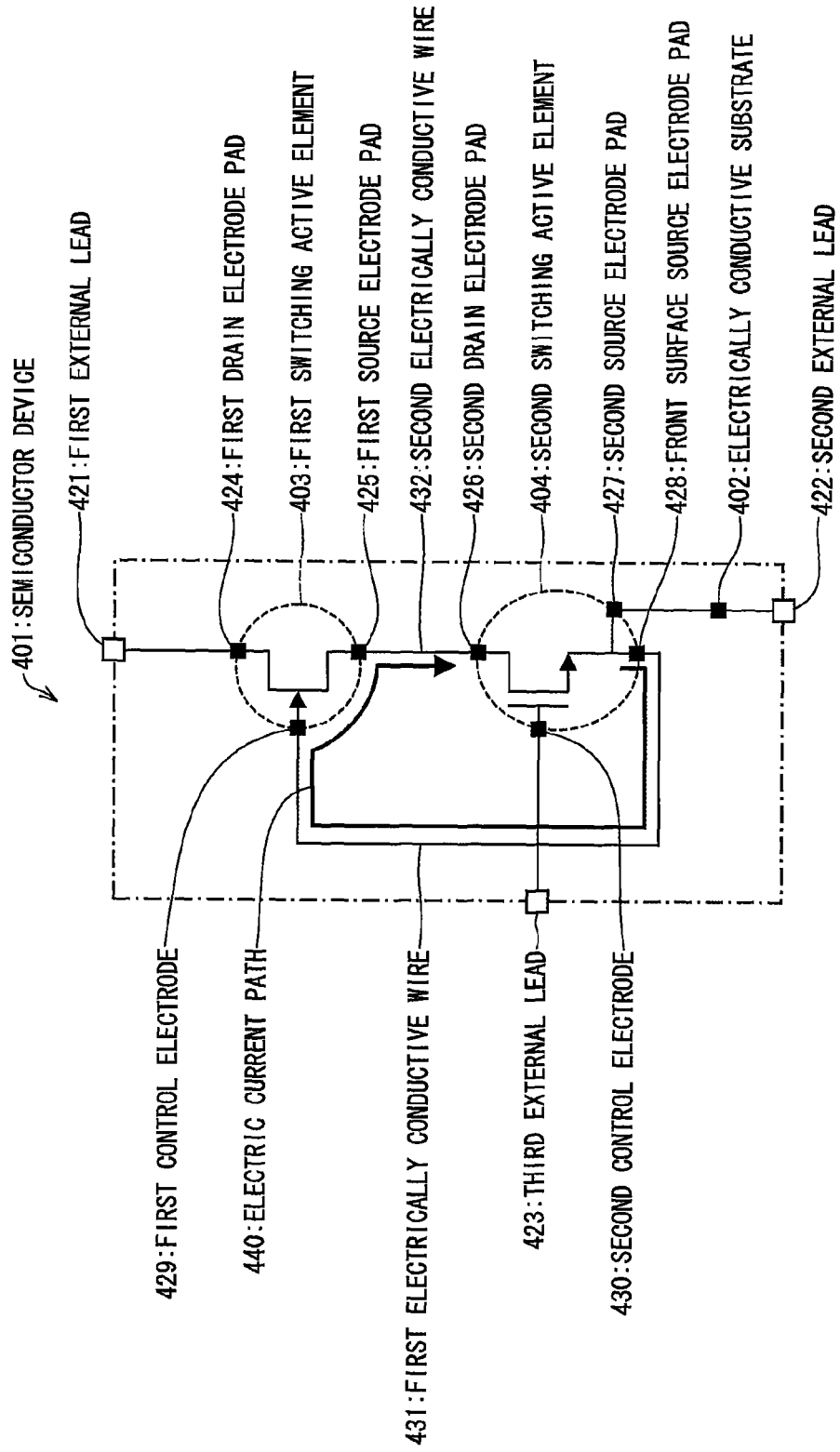

The following description will discuss, with reference to (a) and (b) of FIG. 11 and FIG. 12, a semiconductor device in accordance with another embodiment.

[Structure of Semiconductor Device]

(a) of FIG. 11 is a plan view illustrating a configuration of a semiconductor device 401 in accordance with Embodiment 3 of the present invention. (b) of FIG. 11 is a side view illustrating the configuration of the semiconductor device 401. FIG. 12 is a circuit diagram illustrating a circuit configuration of the semiconductor device 401.

As illustrated in (a) of FIG. 11, the semiconductor device 401 is configured by a TO220 package including three external leads. The semiconductor device 401 includes (i) an electrically conductive substrate 402, (ii) a first switching active element 403, (iii) a second switching active element 404, (iv) first and second electrically conductive wire 431 and 432 (respectively), (v) bonding wires 433 and 434, (vi) a resin mold 441, and (vii) a heatsink 442. The semiconductor device 401 includes, as the three external leads, first through third external leads 421 through 423 (respectively).

The first switching active element 403 is, for example, a field-effect transistor having a GaN layer (i.e. GaN field-effect transistor), and is of a normally-on type. The second switching active element 404 is, for example, a MOS field-effect transistor (MOSFET), and is of a normally-off type.

The entirety of the electrically conductive substrate 402 and respective one ends of the first through third external leads 421 through 423 are covered with the resin mold 441. Neither the first external lead 421 nor the third external lead 423 is connected to the electrically conductive substrate 402. A surface of the electrically conductive substrate 402, on which surface a chip (die) is mounted, is downset. The second external leads 422 and the electrically conductive substrate 402 are downset in an integrated manner.

The heatsink 442, which is integral with the electrically conductive substrate 402, is provided in such a manner as to extend out of the resin mold 441. The heatsink 442 is provided so as to cause heat, which has been radiated from the first switching active element 403 and the second switching active element 404 that are provided on the electrically conductive substrate 402, to be dissipated out of the semiconductor device 401.

On the electrically conductive substrate 402, the first switching active element 403 and the second switching active element 404 are provided.

On a surface (hereinafter referred to as "front surface") of the first switching active element 403 which surface is opposite a contact surface in contact with the electrically conductive substrate 402, the following members are provided: (i) two of first drain electrode pads 424, (ii) first source electrode pads 425, the number of which is the same as the number of the first drain electrode pads 424, and (iii) a first control electrode 429. On a surface (hereinafter referred to as "front surface") of the second switching active element 404 which surface is opposite a contact surface in contact with the electrically conductive substrate 402, the following members are provided: (I) a second control electrode 430, (II) a front surface source electrode pad 428, and (III) second drain electrode pads 426, the number of which is the same the number (two) of the first source electrode pads 425. On the contact surface (hereinafter referred to as "back surface") of the second switching active element 404, a second source electrode pad 427 is provided as illustrated in (b) of FIG. 11.

On the electrically conductive substrate 402, the first source electrode pads 425 and the corresponding second drain electrode pads 426 are provided so that their respective one sides, which are located closest to each other, face each other. The first drain electrode pads 424 and the first external lead 421 are connected to each other via the two bonding wires 433. The second control electrode 430 and the third external lead 423 are connected to each other via the bonding wire 434. The second source electrode pad 427 and the front surface source electrode pad 428 are electrically connected to each other via the second switching active element 404.

The first control electrode 429 and the front surface source electrode pad 428 are connected to each other via the first electrically conductive wire 431. The (two) first source electrode pads 425 and the respective (two) second drain electrode pads 426 are connected via the second electrically conductive wires 432 which are arranged in linear symmetry with respect to the first electrically conductive wire 431 serving as a central axis.

In other words, the first source electrode pads 425 are arranged in linear symmetry with respect to the first electrically conductive wire 431 serving as an axis of symmetry, and the second drain electrode pads 426 are arranged in linear symmetry respect to the first electrically conductive wire 431 serving as an axis of symmetry. In addition, the first source electrode pads 425 and the respective second drain electrode pads 426 are connected via the second electrically conductive wires 432 which are arranged in linear symmetry with respect to the first electrically conductive wire 431 serving as an axis of symmetry.

According to the semiconductor device 401, the first control electrode 429 and the front surface source electrode pad 428 are connected to each other via the first electrically conductive wire 431.

According to the configuration of the semiconductor device 401 thus described, two loop-like electric current paths (first and second electric current paths), in each of which an electric current flows by a route passing through a first source electrode pad 425, a second electrically conductive wire 432, a second drain electrode pads 426, the front surface source electrode pad 428, the first electrically conductive wire 431, and the first control electrode 429, are formed so as to be in linear symmetry with respect to the first electrically conductive wire 431 in the plan view of the first switching active element 403 and second switching active element 404, which are cascode-connected to each other.

Since the first and second electric current paths are thus configured to be in the form of linear symmetry, it is possible to reduce influence of parasitic parameters on electrical characteristics in comparison with a semiconductor device in which two or more electric current paths are asymmetrical.

In addition, according to semiconductor device 401, the first switching active element 403 and the second switching active element 404 are mounted to be located as close to each other as possible so that the first source electrode pads 425 and the second drain electrode pads 426 can be provided as close to each other as possible. Specifically, the first switching active element 403 and the second switching active element 404 are mounted with a minimum distance therebetween, which minimum distance meets constraint conditions. The constraint conditions of the semiconductor device 401 are determined by mounting precision with which the first and second switching active elements 403 and 404 are mounted on the electrically conductive substrate 402 with the use of a die-bonder.

Furthermore, according to the semiconductor device 401, the second electrically conductive wires 432 are wired as low as possible within wiring limits. Note that the wiring limits are limits (i) concerning a height of the wiring in the semiconductor device 401 and (ii) determined by a thickness of the resin mold 441, performance of the wires, mounting conditions, and the like.

Embodiment 3 thus employs a configuration in which lengths of the second electrically conductive wires 432 are made as short as possible by (i) minimizing the distance between the first switching active element 403 and the second switching active element 404 up to the limit under the constraint conditions as well as (ii) causing the height of the wiring to be as low as possible. This causes the loop area of the electric current paths to be small, and therefore makes it possible to minimize the influence of the parasitic parameters on the electrical characteristics.

[Electric Current Path and Circuit Diagram]

FIG. 12 is a circuit diagram illustrating one of electric current paths 440 represented as first and second electric current paths. The electric current path 440 differs from the electric current paths 240 in that an electrically conductive substrate 402 is not part of the electric current paths 440.

The electric current paths 440 are configured as follows: The drain electrode (first drain electrode pad 424) of the first switching active element 403 is connected to the first external leads 421. The source electrodes (first source electrode pads 425) of the first switching active element 403 are connected to their corresponding drain electrodes (second drain electrode pads 426) of the second switching active element 404. The gate electrode (first control electrode 429) of the first switching active element 403 is connected to the front surface source electrode (front surface source electrode pad 428) on the front surface of the second switching active element 404. Another source electrode (second source electrode pad 427) of the second switching active element 404 is connected to the second external leads 422 via the electrically conductive substrate 402. The gate electrode (second control electrode 430) of the second switching active element 404 is connected to the third external leads 423. The first control electrode 429 and the front surface source electrode pad 428 are connected to each other via the first electrically conductive wire 431. The first source electrode pads 425 and their corresponding second drain electrode pads 426 are connected to each other via the respective second electrically conductive wires 432.

According to the semiconductor device 401, as described earlier, the two loop-like electric current paths 440, in each of which an electric current flows by a route passing through a first source electrode pad 425, a second electrically conductive wire 432, a second drain electrode pad 426, the front surface source electrode pad 428, the first electrically conductive wire 431, and the first control electrode 429, are formed in symmetry with respect to the first electrically conductive wire 431 serving as an axis of symmetry in the plan view of the semiconductor device 401. This causes the respective loop areas and the respective forms of the two loop-like electric current paths 440 to be identical to each other.

Note that the loop area of each electric current path 440 refers to projected area of the electric current path 440 in the plan view or in the side view of the electric current path 440. If the respective loop areas of the two electric current paths 440 differed from each other in area or form, then it would cause the electrical characteristics to be susceptible to the parasitic parameters. According to Embodiment 3, however, the electric current paths 440 are in the form of linear symmetry with respect to the first electrically conductive wire 431. This causes the respective loop areas to be identical to each other, and therefore makes it unlikely for the electrical characteristics to be influenced by the parasitic parameters.

An operation of the semiconductor device 401 and a method for manufacturing the semiconductor device 401 are similar to those according to the earlier embodiments, and therefore will not be described.

[Comparison of Constraint Conditions]

According to the configuration of the semiconductor device 401 in accordance with Embodiment 3, it is possible to cause first and second switching active elements 203 and 204 to be located closer to each other in comparison with the configuration in accordance with Embodiment 2 (hereinafter referred to as "configuration X") in which, as illustrated in (a) and (b) of FIG. 8, a connection is made by causing one end of the first electrically conductive wire 231 to be situated on the electrically conductive substrate 202 which is located between the first and second switching active element 203 and 204. This allows the loop area of the electric current paths 440 to be smaller than that of the electric current paths 240, resulting in the reduction of the occurrence of ringing. The reason for the result is as follows:

Note that a space between a first switching active element and a second switching active element will be referred to as "chip-to-chip space" in the explanation.

According to the configuration X, the first and second switching active elements are each connected (die-bonded) to the electrically conductive substrate with the use of a material (die-bonding material) such as a solder, a silver paste, or (as an insulating material) epoxy. Therefore, it is required to design a chip-to-chip space in view of the aforementioned constraint conditions such as (i) the bonding precision of a die-bonding device (die-bonder), (ii) the extent to which a die-bonding material spreads out after the die-bonding, and (iii) bonding precision (connection precision) of a device (wire bonder) in bonding the first electrically conductive wire to the chip-to-chip space. Examples of the bonding precision of the wire bonder encompass (I) thicknesses of the first and second switching active elements, (II) a thickness of a tool of the wire bonder, and (III) precision of the wire bonder itself.

According to the semiconductor device 401, however, there is no need to consider such constraint conditions. This is because the first electrically conductive wire 431, one end of which is connected to the first control electrode 429, has the other end thereof (i) connected to the front surface source electrode pad 428 which is provided on the front surface of the second switching active element 404 and (ii) not connected to the electrically conductive substrate 402. This makes it unnecessary to consider the above constraint conditions (although it is still necessary to consider the precision with which to mount the first and second switching active elements 403 and 404 on the electrically conductive substrate 402 with the use of a die-bonder). Therefore, it is possible to reduce, in comparison with the configuration X, the chip-to-chip space by how much length it would otherwise require the chip-to-chip space to be maintained in view of the constraint conditions.

In the case of the configuration X, in order to enable the front surface of the electrically conductive substrate to be bonded, it may be also necessary to clean the front surface, depending on a condition of the front surface. According to the configuration of the semiconductor device 401, however, such a process is unnecessary.

Since the semiconductor device 401 is thus configured so that the first electrically conductive wire 431 is connected to the front surface source electrode pad 428, it is unnecessary to connect the first electrically conductive wire 431 to part of the electrically conductive substrate 402, which part falls on the chip-to-chip space. This allows the chip-to-chip space, that is, the distance between the first and second switching active elements 403 and 404, to be reduced in comparison with the case of the configuration X in which the first electrically conductive wire is connected to the electrically conductive substrate. The configuration of the semiconductor device 401 further brings such an advantage that it is unnecessary to carry out a manufacturing process in which the front surface of the electrically conductive substrate 402 is to be cleaned in preparation for the wire bonding. In short, the configuration of the semiconductor device 401 allows a simpler mounting process and therefore allows easier mounting of the members than does the configuration X.

Embodiment 4

Figure 9:
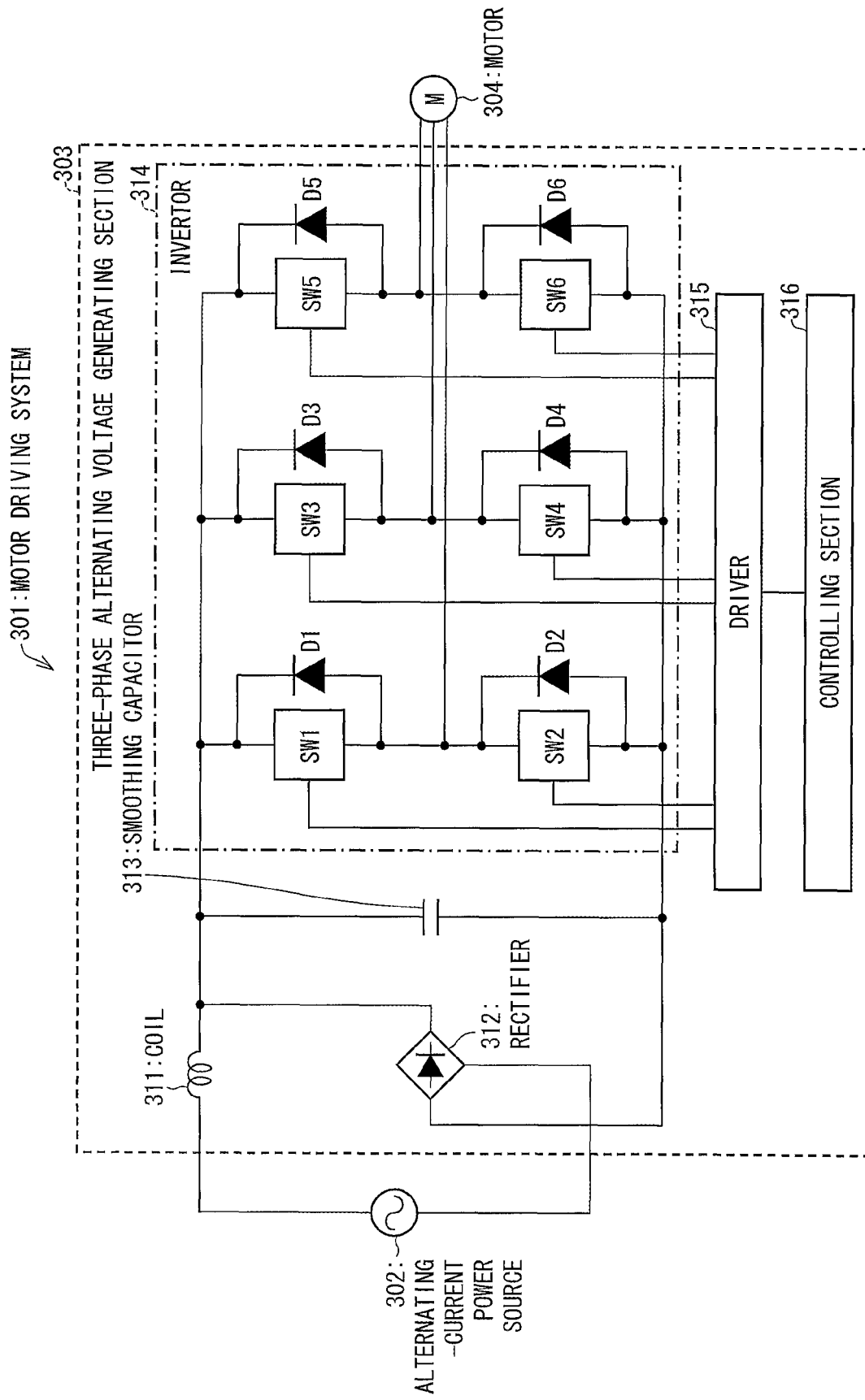
FIG. 9 is a circuit diagram schematically illustrating a configuration of a motor driving system in accordance with Embodiment 4 of the present invention.

The following description will discuss another embodiment of the present invention with reference to FIG. 9.

FIG. 9 is a circuit diagram illustrating a configuration of a motor driving system 301 in accordance with Embodiment 4 of the present invention.

As illustrated in FIG. 9, the motor driving system 301 is configured so that a three-phase alternating voltage generating section 303 generates a three-phase alternating voltage from an alternating voltage of an alternating-current power supply 302, and then applies the three-phase alternating voltage to a motor 304 (three-phase alternating current motor).

The three-phase alternating voltage generating section 303 includes a coil 311, a rectifier 312, a smoothing capacitor 313, an inverter 314, a driver 315, and a controlling section 316.

The rectifier 312 carries out full-wave rectification of the alternating voltage received from the alternating-current power supply 302 via the coil 311. The smoothing capacitor 313 smooths the alternating voltage thus rectified by the rectifier 312.

The inverter 314 (electronic device) includes switching elements SW1 through SW6 so that (i) the switching elements SW1 and SW2 are placed across the smoothing capacitor 313 and connected in series, (ii) the switching elements SW3 and SW4 are placed across the smoothing capacitor 313 and connected in series, and (iii) the switching elements SW5 and SW6 are placed across the smoothing capacitor 313 and connected in series. Diodes D1 through D6 are each connected to both ends of a corresponding one of the switching elements SW1 through SW6 (The diodes D1 through D6 correspond to the switching elements SW1 through SW6, respectively). The switching elements SW1 through SW6 are each configured by one of the aforementioned semiconductor devices 101, 201, and 901.

The switching elements SW1 through SW6 of the inverter 314 (i) causes, by being switched therebetween in response to a driving signal transmitted from the driver 315, a direct voltage, which has been obtained by smoothing the alternating voltage with the smoothing capacitor 313, to be converted into a three-phase alternating voltage and then (ii) supplies the three-phase alternating voltage to the motor 304. The motor 304 is to be rotated according to the three-phase alternating voltage.

The controlling section 316 outputs, according to a three-phase alternating voltage detected by an output voltage detecting device (not illustrated), a controlling signal to be supplied to the driver 315. The driver 315 outputs a driving signal according to the controlling signal.

According to the motor driving system 301, one of the semiconductor devices 101, 201, 401, and 901, in each of which the influence of the parasitic parameters on the electrical characteristics is reduced, is used as each of the switching elements SW1 through SW6 of the inverter 314. This causes a reduction in length of time required for a voltage to cease fluctuating during a process of switching, and therefore allows the motor 304 to be driven with stability while electric power consumption is reduced. In addition, the motor driving system 301 configured as such is to be used for driving compressors of devices such as a refrigerator and an air conditioner. Therefore, the motor driving system 301 contributes to (i) stability of operations of the devices and (ii) a reduction in electric power consumption of the devices.

[Other Remarks]

The above embodiments can also be described as follows:

The semiconductor device includes: a first switching active element which is of a normally-on type; a second switching active element which is of a normally-off type; and an electrically conductive substrate, the first switching active element and the second switching active element being mounted on the electrically conductive substrate so as to be cascode-connected to each other, the first switching active element, the second switching active element, and the electrically conductive substrate being sealed, the first switching active element having at least one first source electrode pad, a first drain electrode pad, and a first control electrode which are provided on a front surface of the first switching active element, the second switching active element having (i) a second drain electrode pad and a second control electrode which are provided on a front surface of the second switching active element and (ii) a second source electrode pad provided on a back surface of the second switching active element, the back surface being opposite a contact surface in contact with the electrically conductive substrate, the first control electrode being connected to the electrically conductive substrate via a first electrically conductive wire, and the first source electrode pad and the second drain electrode pad being (I) provided in proximity to each other and (II) connected to each other via a second electrically conductive wire.

The semiconductor device in accordance with the embodiments can be described as follows:

A first semiconductor device of an embodiment includes: a first switching active element which is of a normally-on type; a second switching active element which is of a normally-off type; and an electrically conductive substrate, the first switching active element and the second switching active element being mounted on the electrically conductive substrate so as to be cascode-connected to each other, the first switching active element and the second switching active element being sealed, the first switching active element having at least one first source electrode pad, a first drain electrode pad, and a first control electrode which are provided on a front surface of the first switching active element, the second switching active element having (i) a second drain electrode pad and a second control electrode which are provided on a front surface of the second switching active element and (ii) a second source electrode pad provided on a back surface of the second switching active element, the back surface being a contact surface in contact with the electrically conductive substrate, the first control electrode being connected to the electrically conductive substrate via a first electrically conductive wire, and the first source electrode pad and the second drain electrode pad being (I) provided in proximity to each other and at a minimum distance therebetween which falls within tolerances of at least (a) mounting precision with which the first switching active element and the second switching active element are mounted on the electrically conductive substrate and (b) connection precision with which the first electrically conductive wire is connected to the electrically conductive substrate and (II) connected to each other via a second electrically conductive wire.

The first semiconductor device is preferably configured such that the first electrically conductive wire is concealed directly under the second electrically conductive wire in a plan view of the semiconductor device.

According to the configuration, the loop area (projected area) of an electric current path in the plan view is minimal (virtually zero). This allows a reduction in influence of parasitic parameters on electrical characteristics of the semiconductor device.

The first semiconductor device is preferably configured such that: said at least one first source electrode pad comprises a plurality of first source electrode pads and is provided at a position symmetric with respect to the first electrically conductive wire; and said at least one second electrically conductive wire is identical in number to said at least one first source electrode pad, said at least one second electrically conductive wire being provided at a position symmetric with respect to the first electrically conductive wire.

According to the configuration, the semiconductor device has a plurality of electric current paths each of which is formed by, as constituting elements, each of the plurality of first source electrode pads and a corresponding one of the plurality of second electrically conductive wires. In addition, the plurality of first source electrode pads and the plurality of second electrically conductive wires are arranged in symmetry with respect to the first electrically conductive wire. This allows, in each of the electric current paths, a reduction in the influence of the parasitic parameters on the electrical characteristics of the semiconductor device.

A second semiconductor device of an embodiment includes: a first switching active element which is of a normally-on type; a second switching active element which is of a normally-off type; and an electrically conductive substrate, the first switching active element and the second switching active element being mounted on the electrically conductive substrate so as to be cascode-connected to each other, the first switching active element and the second switching active element being sealed, the first switching active element having a plurality of first source electrode pads, a plurality of first drain electrode pads, and a first control electrode which are provided on a front surface of the first switching active element, the first drain electrode pads being identical in number to the first source electrode pads, the second switching active element having a plurality of second drain electrode pads, a second control electrode, and a front surface source electrode pad which are provided on a front surface of the second switching active element, the second drain electrode pads being identical in number to the first source electrode pads, each of the first source electrode pads and a corresponding one of the plurality of second drain electrode pads being provided in proximity to each other and at a minimum distance therebetween which falls within tolerance of at least mounting precision with which the first switching active element and the second switching active element are mounted on the electrically conductive substrate, the first control electrode and the front surface source electrode pad being connected to each other via a first electrically conductive wire, the front surface source electrode pad being electrically connected to a second source electrode pad provided on a back surface of the second switching active element, the back surface being a contact surface in contact with the electrically conductive substrate, and the plurality of first source electrode pads being arranged in linear symmetry with respect to the first electrically conductive wire, the plurality of second drain electrode pads being arranged in linear symmetry with respect to the first electrically conductive wire, and the plurality of first source electrode pads and the respective plurality of second drain electrode pads being connected via second electrically conductive wires which are arranged in linear symmetry with respect to the first electrically conductive wire.

The first and second semiconductor devices are each preferably configured such that: the first switching active element is a field-effect transistor including a GaN layer; and the second switching active element is a MOS field-effect transistor.

According to the configuration, the first switching active element is a field-effect transistor including a GaN layer which such excellent properties as high withstand voltage, high-speed performance, high resistance to heat, and low on-resistance. With the semiconductor device which operates as a semiconductor device of a normally-off type by combining such first and second switching active elements together, it is possible to increase switching performance as described earlier.

Summary of Embodiments

The present invention is not limited to the description of the embodiments, but can be altered in many ways by a person skilled in the art within the scope of the claims. An embodiment derived from a proper combination of technical means disclosed in different embodiments is also encompassed in the technical scope of the present invention.

INDUSTRIAL APPLICABILITY

The present invention is particularly suitable electronic devices such as a refrigerator and an air conditioner.

REFERENCE SIGNS LIST

101 Semiconductor device
102 Electrically conductive substrate
103 First switching active element
104 Second switching active element
121 First external lead
122 Second external lead
123 Third external lead
124 First drain electrode pad
125 First source electrode pad
126 Second drain electrode pad
127 Second source electrode pad
129 First control electrode
130 Second control electrode
131 First electrically conductive wire
132 Second electrically conductive wire
133 Bonding wire
134 Bonding wire
140 Electric current path
141 Resin mold
201 Semiconductor device
202 Electrically conductive substrate
203 First switching active element
204 Second switching active element
221 First external lead
222 Second external lead
223 Third external lead
224 First drain electrode pad
224a First drain electrode pad
224b First drain electrode pad
225a First source electrode pad
225b First source electrode pad
226 Second drain electrode pad
227 Second source electrode pad
229 First control electrode
230 Second control electrode
231 First electrically conductive wire
232a Second electrically conductive wire
232b Second electrically conductive wire
233a Bonding wire
233b Bonding wire
234 Bonding wire
240 Electric current path
241 Resin mold
401 Semiconductor device
402 Electrically conductive substrate
403 First switching active element
404 Second switching active element
421 First external lead
422 Second external lead
423 Third external lead
424 First drain electrode pad
425 First source electrode pad
426 Second drain electrode pad
427 Second source electrode pad
428 Front surface source electrode pad
429 First control electrode
430 Second control electrode
431 First electrically conductive wire
432 Second electrically conductive wire
433 Bonding wire
434 Bonding wire
440 Electric current path
441 Resin mold
301 Motor driving system
314 Inverter (electronic device)
901 Semiconductor device
902 Electrically conductive substrate
903 First switching active element
904 Second switching active element
921 First external lead
922 Second external lead
923 Third external lead
924 First drain electrode pad
925 First source electrode pad
926 Second drain electrode pad
927 Second source electrode pad
929 First control electrode
930 Second control electrode
931 First electrically conductive wire
932 Second electrically conductive wire
933 Bonding wire
934 Bonding wire
941 Resin mold
960 Electric current path
SW1 through SW6 Switching element

The invention claimed is:

1. A semiconductor device comprising:
   a first switching active element which is of a normally-on type;
   a second switching active element which is of a normally-off type; and
   an electrically conductive substrate,
   the first switching active element and the second switching active element being mounted on the electrically conductive substrate so as to be cascode-connected to each other,
   the first switching active element and the second switching active element being sealed,
   the first switching active element having at least one first source electrode pad, a first drain electrode pad, and a first control electrode which are provided on a front surface of the first switching active element,
   the second switching active element having (i) a second drain electrode pad and a second control electrode which are provided on a front surface of the second switching active element and (ii) a second source electrode pad provided on a back surface of the second switching active element, the back surface being a contact surface in contact with the electrically conductive substrate,
   the first control electrode being connected to the electrically conductive substrate via a first electrically conductive wire, and
   the first source electrode pad and the second drain electrode pad being (I) provided at a minimum distance from each other, inherently constrained by manufacturing equipment and (II) connected to each other via a second electrically conductive wire, and
   a loop-like electric current path, which forms an RLC resonant circuit passing through the first source electrode pad, the second electrically conductive wire, the second drain electrode pad, the second source electrode pad, the electrically conductive substrate, the first electrically conductive wire, and the first control electrode, and has an attenuation coefficient of 1 or more.

2. The semiconductor device as set forth in claim 1, wherein the first electrically conductive wire is concealed directly under the second electrically conductive wire in a plan view of the semiconductor device.

3. The semiconductor device as set forth in claim 1, wherein:
   said at least one first source electrode pad comprises a plurality of first source electrode pads and is provided at a position symmetric with respect to the first electrically conductive wire; and
   said at least one second electrically conductive wire is identical in number to said at least one first source electrode pad, said at least one second electrically conductive wire being provided at a position symmetric with respect to the first electrically conductive wire.

4. The semiconductor device as set forth in claim 1, wherein:
   the first switching active element is a field-effect transistor including a GaN layer; and
   the second switching active element is a MOS field-effect transistor.

5. An electronic device comprising, as a switching element, a semiconductor device as set forth in claim 1.

6. A semiconductor device comprising:
   a first switching active element which is of a normally-on type;
   a second switching active element which is of a normally-off type; and
   an electrically conductive substrate,
   the first switching active element and the second switching active element being mounted on the electrically conductive substrate so as to be cascode-connected to each other,
   the first switching active element and the second switching active element being sealed,
   the first switching active element having a plurality of first source electrode pads, a plurality of first drain electrode pads, and a first control electrode which are provided on a front surface of the first switching active element, the first drain electrode pads being identical in number to the first source electrode pads,
   the second switching active element having a plurality of second drain electrode pads, a second control electrode, and a front surface source electrode pad which are provided on a front surface of the second switching active element, the second drain electrode pads being identical in number to the first source electrode pads,
   each of the first source electrode pads and a corresponding one of the plurality of second drain electrode pads being provided at a minimum distance from each other, inherently constrained by manufacturing equipment,
   the first control electrode and the front surface source electrode pad being connected to each other via a first electrically conductive wire,
   the front surface source electrode pad being electrically connected to a second source electrode pad provided on a back surface of the second switching active element, the back surface being a contact surface in contact with the electrically conductive substrate, and
   the plurality of first source electrode pads being arranged in linear symmetry with respect to the first electrically conductive wire, the plurality of second drain electrode pads being arranged in linear symmetry with respect to the first electrically conductive wire, and the plurality of first source electrode pads and the respective plurality of second drain electrode pads being connected via second electrically conductive wires which are arranged in linear symmetry with respect to the first electrically conductive wire.

7. The semiconductor device as set forth in claim 6, wherein:
   the first switching active element is a field-effect transistor including a GaN layer; and
   the second switching active element is a MOS field-effect transistor.

8. An electronic device comprising, as a switching element, a semiconductor device as set forth in claim 6.

* * * * *